United States Patent
Field et al.

(10) Patent No.: US 10,894,507 B1
(45) Date of Patent: Jan. 19, 2021

(54) REFLECTIVE COATINGS AND REARVIEW ASSEMBLY DEVICE FOR DISPLAYING STATE OF VEHICLE

(71) Applicant: SMR Patents S.à.r.l., Luxembourg (LU)

(72) Inventors: Simon David Field, Flagstaff Hill (AU); Hong Wonsik, Inchon (KR); Jung Jaemun, Inchon (KR)

(73) Assignee: SMR Patents S.à.r.l., Luxembourg (LU)

( * ) Notice: Subject to any disclaimer, the term of this patent is extended or adjusted under 35 U.S.C. 154(b) by 27 days.

(21) Appl. No.: 16/001,423

(22) Filed: Jun. 6, 2018

Related U.S. Application Data

(63) Continuation-in-part of application No. 15/439,188, filed on Feb. 22, 2017, now Pat. No. 10,703,281,
(Continued)

(30) Foreign Application Priority Data

Jan. 24, 2012 (AU) ................. 2012900267

(51) Int. Cl.
| | | |
|---|---|---|
| B32B 3/02 | (2006.01) |
| B60Q 1/26 | (2006.01) |
| G02B 27/14 | (2006.01) |
| B60R 1/062 | (2006.01) |
| B60Q 1/38 | (2006.01) |
| B60K 35/00 | (2006.01) |
| C23C 14/16 | (2006.01) |
| C23C 14/22 | (2006.01) |
| C23C 14/35 | (2006.01) |
| G02B 5/10 | (2006.01) |
| G02B 1/02 | (2006.01) |
| C22C 27/06 | (2006.01) |
| G01R 31/371 | (2019.01) |

(52) U.S. Cl.
CPC ............ *B60Q 1/2665* (2013.01); *B60K 35/00* (2013.01); *B60Q 1/38* (2013.01); *B60R 1/062* (2013.01); *C22C 27/06* (2013.01); *C23C 14/165* (2013.01); *C23C 14/228* (2013.01); *C23C 14/35* (2013.01); *G01R 31/371* (2019.01); *G02B 1/02* (2013.01); *G02B 5/10* (2013.01); *G02B 27/142* (2013.01); *B60K 2370/797* (2019.05); *B60Q 1/2696* (2013.01)

(58) Field of Classification Search
CPC .... B60Q 1/2665; B60K 35/00; B60R 1/1215; B60R 1/02
See application file for complete search history.

(56) References Cited

U.S. PATENT DOCUMENTS

| | | |
|---|---|---|
| 7,012,515 B2 | 3/2006 | Yamamoto et al. |
| 2011/0169956 A1* | 7/2011 | DeLine ................ B60Q 1/2665 348/148 |

(Continued)

*Primary Examiner* — Elizabeth E Mulvaney
(74) *Attorney, Agent, or Firm* — Jones Day

(57) ABSTRACT

A rearview assembly for a vehicle includes a rearview assembly housing, a display on an outer surface of the rearview assembly housing, and a controller configured to receive information on a battery level or a gasoline level of the vehicle, where the display is configured to display the battery level or the gasoline level of the vehicle. The rearview assembly may include a reflective coating, for example a chromium-based reflective coating.

33 Claims, 13 Drawing Sheets

Related U.S. Application Data which is a continuation-in-part of application No. 14/936,024, filed on Nov. 9, 2015, now Pat. No. 9,656,601, which is a continuation-in-part of application No. 14/374,376, filed as application No. PCT/AU2013/000047 on Jan. 24, 2013, now Pat. No. 9,181,616.

(56) References Cited

U.S. PATENT DOCUMENTS

2012/0062744 A1\* 3/2012 Schofield ............. B60S 1/0844
                                                                    348/148
2013/0127612 A1   5/2013 Stadler et al.

\* cited by examiner

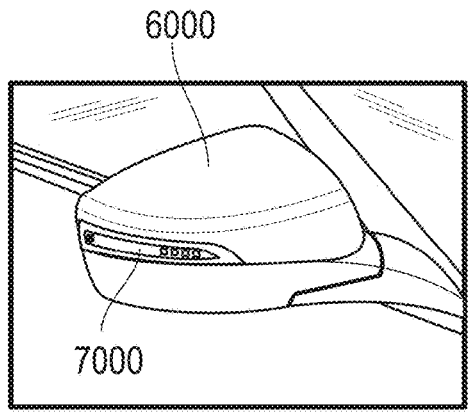
FIG. 20A
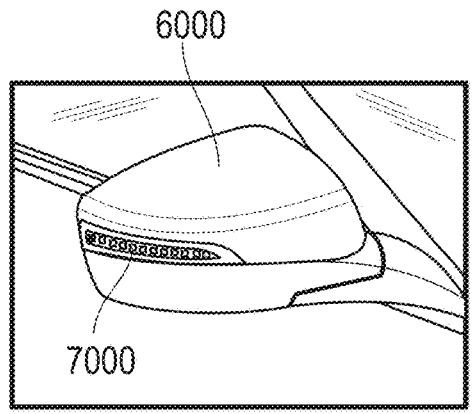
FIG. 20B
| LED Status | Viewing | Battery Level |
|---|---|---|
| Red LED (ON) | ■□□□□□□□□□□□ | Very LOW |
| Red LED (Blinking) | ■□□□□□□□□□□▨ | LOW |
| Green LED (Blinking) | ▨□□□□▨▨▨▨▨▨▨ | MIDDLE |
| Blue LED (ON) | ▨▨▨▨▨▨▨▨▨▨▨▨ | HIGHT |
FIG. 21

REFLECTIVE COATINGS AND REARVIEW ASSEMBLY DEVICE FOR DISPLAYING STATE OF VEHICLE

CROSS-REFERENCE TO RELATED APPLICATIONS

This application is a continuation-in-part of U.S. patent application Ser. No. 15/439,188, filed on Feb. 22, 2017, which is a continuation-in-part of U.S. patent application Ser. No. 14/936,024, filed on Nov. 5, 2015, now U.S. Pat. No. 9,656,601, which is a continuation-in-part of U.S. patent application Ser. No. 14/374,376, filed on Jul. 24, 2014, now U.S. Pat. No. 9,181,616, which is a national stage entry of International Patent Application No. PCT/AU2013/000047, filed on Jan. 24, 2013, which claims the benefit of priority to Australian Patent Application No. 2012900267, filed on Jan. 24, 2012, all of which are hereby incorporate by reference in their entirety for all purposes.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

1. Field of the Invention

The following description relates to a rearview assembly device being coated with a reflective coating, for example, a chromium-based reflective coating. In addition, the following description relates to a rearview assembly device which displays a state of a vehicle, and a vehicle which includes such a rearview assembly device. For example, the rearview assembly device may include one or more light sources which indicate a charge state of an electrical vehicle or gasoline levels of a gasoline operated vehicle.

2. Related Art

Rear view devices including side view mirrors and rear view mirrors typically include a backing plate having a polymeric or other substrate mounted thereto. In certain applications, the substrate may be a glass, polymeric, or metallic substrate that is coated with a reflective coating so that the coating acts as a mirror assembly. Substrate assemblies typically involve manufacturing additional structural components and mounting such components to a mirror assembly in a separate manufacturing process. In some examples, the substrates are molded to mirror assemblies in separate manufacturing processes.

An interesting area of application is the design of ultrathin coatings for use in 'everyday' environments, such as easy-clean coatings on smart phones to mirrors and decorative (colorful) coatings in the automotive industry. For example, chrome finishes with custom colors and tints (often with a "brushed-metal" look) are becoming increasing desirable. Such coatings include tinted and deep dark chromes, as well as satin finishes. Furthermore, prolonged exposure to these 'everyday' environmental conditions requires such ultrathin coatings to possess a level of robustness against factors such as acidic or caustic environments, temperature variations from as low as −80° C. to highs of +80° C., variations in relative humidity, as well as abrasive conditions inflicted by everyday wear and tear.

Additionally, in almost all applications employing such coatings, there is a need for the coating to maintain its integrity over extended periods of operation under varying environmental conditions. That is, the coating should not significantly change reflectivity or color within this time, nor should it delaminate or break away from the underlying substrate.

Further to the above characteristics of permanent and consistent integrity of the coatings, additional properties are desired. For example, in case such coatings are used as coatings for motor vehicle parts, it is desirable that the coatings also provide a certain degree of permeability to light from a natural or artificial light source. This may be suitable for example in case light from a side turn indicator should be visible even through the coating, which otherwise has a decorative effect in masking the light source.

In addition, light modules have been incorporated in vehicle rearview assemblies for various purposes. For example, in exterior rearview assemblies, it is typically common to provide a turn signal light module on either the housing of the assembly or behind a mirror element. When positioned behind the mirror element, the light from the light module may be projected through a transparent window that is formed in front of the lights of the light module or through a partially transmissive, partially reflective layer of the mirror element.

Turn signal indicators provided in exterior rearview assemblies have typically included a plurality of LED devices that all blink together. Exterior rearview assemblies are also known which incorporate a "puddle light" lamp module in the housing of the exterior rearview assembly. Such puddle lights direct light downward from the bottom portion of the housing onto an area of the ground near the front doors of the vehicle.

Electrical vehicles, hybrid vehicles and gasoline operated vehicles are well known in the state of the art. Typically, the energy level or available energy state of a vehicle is provided to a driver in the form of an indicator that is part of the interior of the vehicle. For example, the state of a vehicle's battery or gasoline level is typically provided to a driver on the driver's dashboard, and may be provided in levels by an analog or a digital indicator. It is not typically possible to view the status of a vehicle prior to entering a vehicle; for example, the driver cannot determine whether a vehicle is low on gasoline or battery charge until starting the engine or at least viewing the dashboard.

The above discussion of background is included to explain the context of the present invention. It is not to be taken as an admission that any of the material referred to was published, known or part of the common general knowledge at the priority date of any one of the claims.

SUMMARY

In an aspect, a rearview assembly for a vehicle includes a polymeric rearview assembly housing which is coated with a chromium-based reflective coating, an indicator disposed within or on an outer surface of the polymeric rearview assembly housing, and a controller configured to receive information on a battery level or a gasoline level of the vehicle, where the indicator is configured to use the received information to display the battery level or the gasoline level of the vehicle, and the polymeric rearview assembly housing and the chromium-based reflective coating are both at least partially permeable to light originating from the indicator.

The one or more light sources may be further configured to operate as a turn signal in response to a turn signal being activated.

The one or more light sources may be further configured to operate as a hazard signal in response to a hazard signal being activated.

In response to the vehicle's ignition being turned on, the one or more light sources may be configured to operate as at least one of a turn signal and a hazard signal and cannot operate to display the battery level or gasoline level of the vehicle.

The controller may include a driver for running operations, a memory for storing vehicle information, an input/output unit for sending signals to the one or more light sources, and a CAN/LIN for communicating with the vehicle.

The one or more light sources may be configured to project more than one color using the received information on the battery level or the gasoline level of the vehicle.

The one or more light sources may be a plurality of light sources which are arranged in a line on the rearview housing.

All of the plurality of light sources may turn on in response to receiving information that the battery level or gasoline level is full, and one or more light sources of the plurality of light sources may be off in response to receiving information that the battery level or gasoline level is low.

At least one of the plurality of light sources may be configured to blink.

The rearview assembly may include one or more of a reflective element and a camera, and the polymeric rearview assembly housing at least partly houses the one or more of the reflective element and the camera.

The indicator may be configured to be operated by a remote control which is part of a vehicle locking system, a garage opening system, or other remote activation system.

The indicator may be incorporated into the polymeric rearview assembly hosing by over-molding the indicator with polymeric material of the polymeric rearview assembly hosing.

The indicator may include a polymeric light pipe which comprises at least one LED lamp to illuminate the light pipe.

The chromium-based reflective coating may be an alloy of chromium and a dopant material, the dopant material being selected from hexagonally close-packed transition metals and the alloy having a crystal structure of a primary body-centered cubic phase in coexistence with a secondary omega hexagonally close-packed phase.

The alloy may be a binary alloy of chromium and the dopant material.

The atomic percentage of the dopant material in the binary alloy may be in the range of from about 1.9 at. % to about 5.8 at. %.

The dopant material may be selected from the hexagonally close-packed transition metals zirconium, titanium, cobalt, hafnium, rubidium, yttrium and osmium.

The dopant material may be selected from the hexagonally close-packed transition metals zirconium, titanium, cobalt, hafnium, rubidium, yttrium and osmium.

The alloy may be a binary alloy and the dopant material may be zirconium, there the atomic percentage of the zirconium in the binary alloy is in the range of from about 4.5 at. % to about 5.8 at. %.

The alloy may be a binary alloy and the dopant material may be titanium, where the atomic percentage of the titanium in the binary alloy is in the range of from about 1.9 at. % to about 5.8 at. %.

The alloy may be a binary alloy and the dopant material may be cobalt, where the atomic percentage of the cobalt in the binary alloy is in the range of from about 1.9 at. % to 5.7 at. %.

The chromium-based reflective coating may have a thickness of 200 nm or less.

The thickness of the reflective coating may be 100 nm or less.

The thickness of the reflective coating may be in the range of from 40 nm to 80 nm.

The thickness of the reflective coating may be in the range of from 50 nm to 70 nm.

The thickness of the reflective coating may be about 60 nm.

In another aspect, a vehicle includes a rearview assembly including a polymeric rearview assembly housing which is coated with a chromium-based reflective coating, an indicator disposed within or on an outer surface of the polymeric rearview assembly housing, and a controller configured to receive information on a battery level or a gasoline level of the vehicle, at least one of a battery management system and a gasoline management system, and a body control module for receiving a door lock/unlock signal, where the indicator is configured to display the battery level or the gasoline level of the vehicle in response to the body control module receiving the door lock/unlock signal, and the polymeric rearview assembly housing and the chromium-based reflective coating are both at least partially permeable to light originating from the indicator.

The controller may include a CAN/LIN, the at least one of the battery management system and the gasoline management system may include a CAN/LIN, and the body control module may include a CAN which are all in communication with one another.

In response to the vehicle's ignition being turned on, the one or more light sources may be configured to operate as at least one of a turn signal and a hazard signal and cannot operate to display the battery level or gasoline level of the vehicle.

In yet another aspect, a rearview assembly for a vehicle includes a rearview assembly housing, an indicator disposed within or on an outer surface of the rearview assembly housing, and a controller configured to receive information on a battery level or a gasoline level of the vehicle, where the indicator is configured to use the received information to display the battery level or the gasoline level of the vehicle, and the indicator is configured to display the battery level or the gasoline level of the vehicle in response to a vehicle lock or vehicle unlock command being initiated.

In an aspect, a mirror assembly includes a mirror housing, a reflective element having a first field of view, a reflective coating having a second field of view, the second field of view being wider than the first field of view, and a multi-function backing plate supported by the mirror housing and comprising a reflective element supporting region where the reflective element is supported by the multi-function backing plate and a reflective coating supporting region where the reflective coating is applied to the backing plate.

The reflective coating supporting region may be convex so that the reflective coating is convex and provide a wider field of view.

The reflective element supporting region may include an aperture for receiving the reflective element, and the reflective coating supporting region may be thicker than the reflective element supporting region.

The reflective coating may be a chromium-based reflective coating.

In another aspect, the present description relates to a backing plate or a polymeric substrate, wherein the backing plate or polymeric substrate is coated with a reflective coating such as a chromium-based reflective coating.

The present description also provides the chromium-based reflective coating for a backing plate or a polymeric substrate, wherein the coating is an alloy of chromium and a dopant material, the dopant material being selected from the hexagonally close-packed transition metals, the alloy having a crystal structure of a primary body-centered cubic phase in coexistence with a secondary omega hexagonally close-packed phase. In a preferred form of the present invention, the alloy is a binary alloy of chromium and the dopant material.

The present description also provides a method of forming a chromium-based reflective coating on a backing plate or a polymeric substrate, the method including applying chromium and a dopant material to the polymeric substrate by physical vapour deposition, the dopant material being selected from the hexagonally close-packed transition metals, to form an alloy coating, the alloy coating being applied so as to have a crystal structure of a primary body-centered cubic phase in coexistence with a secondary omega hexagonally close-packed phase. In a preferred form of the present invention, the alloy is applied so as to be a binary alloy of chromium and the dopant material.

In one embodiment of the invention the at least one light element is arranged on one side of the polymeric substrate, and wherein the polymeric substrate and the chromium-based reflective coating are at least in part permeable to light originating from the at least one light element.

The polymeric substrate may be used in different technical fields, such as in automotive industry, advertising industry or any industry which provides products having a protective coating that does also provide light reflective as well as light transmission properties.

The chromium-based reflective coating according to the invention is based on an alloy comprising chromium. Chromium is a Group 6 member of the transition metals and has a body-centered cubic (bcc) crystal structure. Incorporated as the primary component in the preferred binary alloy of the present invention, being an alloy of two principal metallic components, chromium is used primarily for its contribution towards producing a shiny, hard surface that is resistant to corrosion, thus bringing to the alloy the desirable property of optical reflectivity, preferably with an R % greater than 50% so as to find acceptable use in forming a mirror. It has a high melting point, a stable crystalline structure and moderate thermal expansion, making it an ideal primary component for use in the harsh environmental conditions described above.

The secondary component of the preferred binary alloy is the dopant material mentioned above, the dopant material herein often being referred to as M and being selected from the hexagonally close-packed (hcp) transition metals. The hcp structure is the most common among the transition metals, including the transition metals zirconium (Zr), titanium (Ti), cobalt (Co), hafnium (Hf), rubidium (Ru), yttrium (Y), and osmium (Os). In this respect, some of these hcp transition metals, such as Zr, Ti and Co are practically easier materials to work with and so will be preferred dopant materials for the purposes of the present invention.

While it is envisaged that Zr will be the most preferred hcp dopant material, and thus the present invention will be described herein mainly with reference to Zr as the hcp dopant material, this should not be regarded as a limitation on the scope of the present invention.

In a preferred form of the present invention, the alloy will be a binary alloy and the atomic percentage of the dopant material in the binary alloy will be in the range of from about 1.9 at. % to about 5.8 at. %. However, within this broad range, there may be narrower ranges that relate to specific dopant materials, as will be described further below.

It has been found that the introduction of small amounts of a hcp dopant material to the chromium (a bcc transition metal) can yield a range of alloy compositions having an intermetallic crystal structure that has bcc and omega-hcp phases coexisting, which has been found to provide those alloys with further advantageous properties (beyond those of chromium alone). Indeed, it has been found that the careful selection of the amount of hcp dopant material relative to the amount of chromium can give rise to alloy compositions within those ranges that are particularly preferred, where desirable properties (such as abrasion resistance) are maximized and undesirable properties (such as a color other than a neutral color) are minimized.

By way of explanation, it has been found that coatings according to the present invention change in phase composition as the elemental composition of the dopant material is increased, from bcc only, to bcc plus omega-hcp, to bcc plus an amorphous phase. The optical and mechanical properties observed for the coatings show variation commensurate with these changes in composition, with the preferred optical and mechanical properties occurring when the phase composition is bcc plus omega-hcp. Without wishing to be bound by theory, it is believed that the observed changes are due to the changing electron structure of the atoms and the crystallographic conformation relative to each other.

Specifically, when the phase composition was bcc plus omega-hcp, the crystal structure of the coatings demonstrated d-orbital transitions which gave rise to neutral color and relatively lower reflectivity, with the well-ordered crystal structure yielding higher relative resistance to abrasion. By way of comparison, when the amorphous phase was present, the d-orbital transitions were no longer observed, indicating that the orbital hybridization between neighbouring atoms was partially filling the d-orbitals, correlating with a less-preferred lower reflectivity. Furthermore, the lower atomic packing density in such an amorphous phase was found to yield coatings with reduced resistance to abrasion, which of course is also less desirable.

With this in mind, and referring to the dopant material as M in the general formula $CrM_x$, this transition of phase from bcc plus omega-hcp, to bcc plus an amorphous phase, was found to occur at values of x of about 0.06, correlating to about 5.8 at. %, when the dopant material was Zr. The same transition is expected to occur at about the same value of x also for Ti and Co.

Unlike the reflectivity, the color of the coatings of the present invention was found to not show a change in trend at the transition of the phase from bcc plus omega-hcp, to bcc plus an amorphous phase. To the contrary, at the transition of the phase from bcc to bcc plus omega-hcp, which was found to occur for Zr at values of x (in the above general formula) of about 0.05 (correlating to a lower limit of about 4.5 at. %), a transition in the color of the coatings of the present invention was found. This suggests the onset of the orbital hybridization in the electron structure occurs at concentrations of Zr as the dopant material close to about 4.5 at. %. However, the same transition point for Co as the dopant material was found to be about 1.9 at. %.

By way of explanation, and again using Zr as the exemplary hcp dopant material, at low concentrations there is an increase in the resistance to abrasion upon increasing the elemental composition of Zr. A maximum in the resistance to abrasion is observed at the transition from bcc to the bcc plus omega-hcp, after which increasing the Zr concentration leads to a steady decrease in the measured abrasion ratio. Indeed, from an electron diffraction analysis of $CrZr_x$ coatings, two transition concentrations are defined that represent the change from one phase composition to another. For Zr as the dopant material, these transitions are at about x=0.05 (bcc to bcc+Ω-hcp) and about 0.06 (bcc+Ω-hcp to bcc+amorphous). In this respect, the omega-hcp phase is understood to be a displacive phase transformation from the bcc structure.

Accordingly, in one form of the present invention, the alloy will be a binary alloy and the dopant material will be Zr, wherein the atomic percentage of the dopant material in the binary alloy will be in the range of from about 4.5 at. % to about 5.8 at. %.

In yet another form of the present invention, the alloy will be a binary alloy and the dopant material will be Co, wherein the atomic percentage of the dopant material in the binary alloy will be in the range of from about 1.9 at. % to about 5.7 at. %. In relation to predictive conclusions able to be drawn by the inventors (based on the similarity in the physical nature of all hcp transition metals) from the experimental work (described below) conducted in relation to Zr and Co, and to an extent Ti, it will be appreciated by a skilled addressee that the behaviour of the other hcp transition metals as the dopant material in the present invention can be reasonably expected to be the same or similar to that as seen with Zr, Co and Ti. Indeed, the comparative experimental work conducted (again, see below) on the bcc transition metal molybdenum (Mo), where similar behavior was not expected (and was not seen) due to the different physical nature of this transition metal, also tends to confirm these predictive conclusions about the hcp transition metals.

Indeed, given that the physical nature of the other hcp transition metals is similar to both Zr and Co, it is expected that Ti, Hf, Ru, Y and Os will display the same structure forming abilities in the Cr based alloy of the present invention when their concentration is within the range of about 1.9 at. % to about 5.8 at. %.

The coatings of the present invention are preferably ultrathin coatings, wherein the thickness is selected to achieve the desired optical property, such as transmission and/or reflectivity. For example, the coating is being defined in this specification to be a coating with a thickness of 200 nm or less. In one embodiment, the coating has a thickness of 100 nm. It is envisaged that preferred thicknesses will be in the range of 100 nm or less, or more preferably in the range of 40 nm to 80 nm, or more preferably in the narrower range of 50 nm to 70 nm. Ideally, the thickness will be about 60 nm.

Preferably, the inventive polymeric substrate is formed by injection compression moulding, although any other method known in the art, such as compression moulding, blow moulding, reaction moulding and sheet casting, could also be utilised and thus also falls within the scope of the present invention.

The polymeric substrate may be any known type of polymeric substrate material and for example could be a substrate formed from a material selected from the group including polyacrylate, polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these. Preferred substrate materials include polycarbonate, poly (2,2'-dihydroxyphenylpropane) carbonate, polydiethyleneglycol bis (allyl carbonate), polymethylmethacrylate and polystyrene, or blends thereof.

The polymeric substrate or the backing plate bearing the coating of the present invention may also include other coatings (pre-coatings) either between the coating and the substrate, within the coating, or as an outer layer. In particular, it is envisaged that in some embodiments it will be advantageous to include a hardcoating between the coating and the substrate or as an outer coating. In this form, the hardcoating is a protective layer which does not contribute to the overall desired optical effect, while in other embodiments an external protective layer upon the decorative coating will itself be a hardcoating.

In this respect, a coating that is said to be a "hardcoating" is a coating that is harder and stiffer than the substrate, whereby it increases the abrasion resistance of that substrate. Examples for hardcoats are, but not limited to, organo-silicon, an acrylic, a urethane, a melamine or an amorphous $SiO_xC_yH_z$. Such an abrasion resistant hard coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM 04060 "Standard Test Method for Abrasion Resistance of Organic Coatings", by the Taber Abrader, or by using the well-known Steelwool Test.

The abrasion resistant layers are preferably formed from one or more materials selected from the group consisting of an organo-silicon, an acrylic, a urethane, a melamine or an amorphous SiOxCyHz. Most preferably, the abrasion resistant layer is an organo-silicon layer, due to its superior abrasion resistance and compatibility with physical vapour deposited films. For example, an abrasion resistant layer comprising an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gammaglycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl) ethyltriethoxysilane, gamma-methacryloxypropyltrimethyoxysilane, gamma-aminopropyltrimethoxysilane, gamma-aminopropyltriethoxysilane, gammameraptopropyltrimethoxysilane, gamma-mercaptopropyltriethoxysilane, Nbeta(aminoethyl)-gamma-aminopropyltrimethoxysilane, betacyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gammaglycidoxypropylmethyldimethoxysilane, gammaglycidoxypropylmethyldiethoxysilane, gamma-glycidoxypropylphenyldimethoxysilane, gammaglycidoxypropylphenyldiethoxysilane, gamma-chloropropylmethyldimethoxysilane, gamma-chloropropylmethyldiethoxysilane, dimethyldiacetoxysilane, gammamethacryloxypropylmethyldimethoxysilane, gammametacryloxypropylmethyldiethoxysilane, gammamercaptopropylmethyldimethoxysilane, gamma-mercaptopropylmethyldiethoxysilane, gamma-aminopropylmethyldimethoxysilane, gammaaminopropylmethyldiethoxysilane, methylvinyldimethoxysilane, methylvinyldiethoxysilane and the like.

The pre-coated films may also include, inorganic oxides (silica, titania, alumina), thin metal films (Cr, etc), where the pre-coated substrate has been prepared to have the desirable surface energy, residual stress, thermal coefficient of expansion, conductivity, chemical functionality, etc, as required by the specific application of such a Cr based alloy coating.

In a similar manner, a skilled addressee will understand that an overcoating may be applied over the coating of the present invention, which overcoating could include transparent coatings for the purposes of mechanical strength, wettability, optical interference filters, modified coefficient of friction, etc. The overcoating may be the abve hardcoating or any other protective layer. Such protective layer(s) provide enhanced abrasion resistance, fingerprint resistance and 'easy clean' functionality. Suitable materials for such a protective layer could be plasma polymerised hexamethyldisiloxane (HMDSO), fluoro polymer based coatings deposited via evaporation or liquid transfer techniques, or a liquid hardcoat applied via spin, dip, spray or flow coating techniques, with or without particulate additives for haze control (matt additive). In one embodiment, in case the polymeric substrate is used as a housing of a rear view device, the overcoating is permeable to light from the light element and may have the same color as the rest of the rear view device and the vehicle. In one embodiment the color may be different to the rest of the vehicle.

In a preferred form, the physical vapour deposition techniques adopted in the method of the present invention will be based upon magnetron sputtering, be it from a primary alloy target or using a co-sputtering process involving two targets made from the respective components of the alloy. Alternatively, it will be appreciated that the preferred alloy could be deposited using thermal evaporation or e-beam evaporation of the respective alloy components.

Before turning to a description of various preferred embodiments of the present invention, it will be appreciated that, due to the nature of polymeric substrates, conventional temperature processing (during or after deposition) could generally not be employed to modify the properties of alloy coatings of the type of the present invention, although this finally depends on the polymeric material of the polymeric substrate. In the inventive coatings, the inventors have determined that the preferred alloys change in phase composition as the elemental composition of a dopant material (such as Zr, Ti or Co) is increased; from bcc only, to bcc plus Ω-hcp, to bcc plus an amorphous phase. The optical and mechanical properties for these preferred alloys (as ultrathin coatings) show variation commensurate with the composition and observed changes relate to the changing electron structure of the atoms and the crystallographic conformation relative to each other.

Indeed, these crystalline ultrathin coatings demonstrate d-orbital transitions that give rise to neutral color and relatively lower reflectivity, with a well ordered crystal structure yielding higher relative resistance to abrasion. When amorphous material is present in the coatings, the d-orbital transitions are no longer observed, indicating the partial filling of the d-orbitals. It is believed that the orbital hybridization between neighbouring atoms partially fills the d-orbitals, correlating with a yellow color and higher reflectivity. Furthermore, the lower atomic packing density in the amorphous phase yielded coatings with reduced resistance to abrasion.

It should be appreciated that a number of different coating compounds are described throughout the present description and that the present invention is not limited to such coatings. For example, a coated backing plate in accordance with the present description may be coated by any type of reflective coating not limited to the coatings described herein.

DESCRIPTION OF THE SEVERAL VIEWS OF THE DRAWINGS

The present invention will now be described in relation to various preferred embodiments of which some aspects are illustrated by the accompanying figures, with other aspects being illustrated by the following examples as summarized in the following tables. In the figures:

FIG. 20A is a diagram illustrating an example of a rearview assembly device for displaying a state of a vehicle showing a low battery state.

FIG. 20B is a diagram illustrating an example of a rearview assembly device for displaying a state of a vehicle showing a high battery state.

FIG. 21 is a diagram illustrating an example of LED status and display for a number of different battery or gasoline levels.

DETAILED DESCRIPTION

Figure 1:
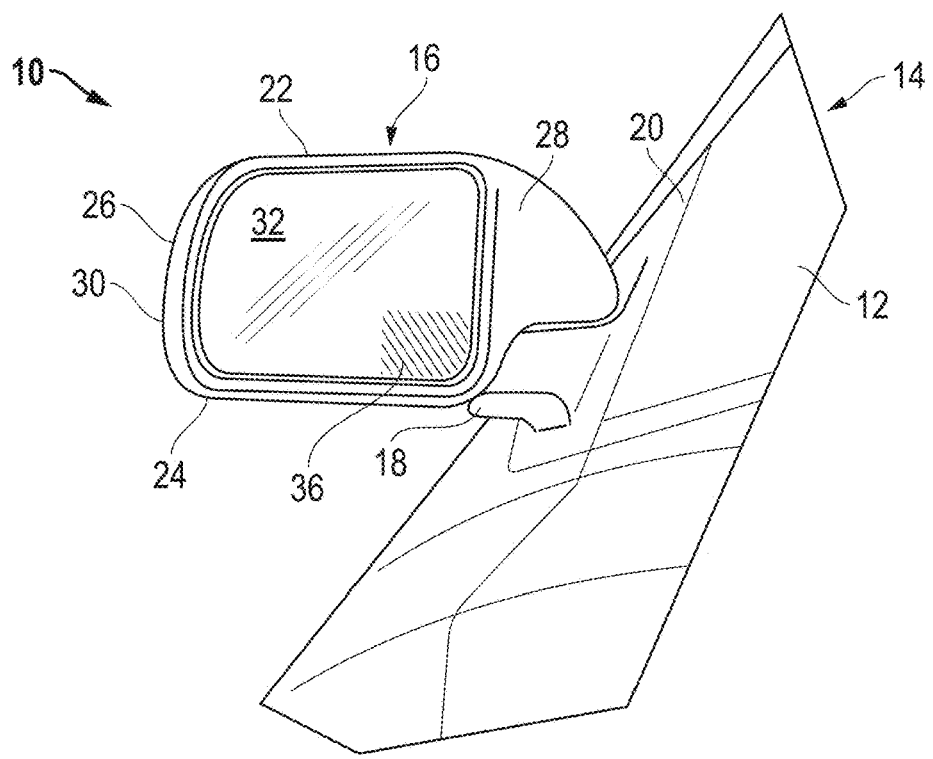
FIG. 1 is a perspective view of an exterior rear view mirror assembly or side view mirror assembly having a backing plate for mounting a main mirror and a reflective coating that is directly coated to a surface of the backing plate for providing a spotter mirror image.

Before explaining at least one example of the invention in detail, it is to be understood that the invention is not limited in its application to the details of construction and to the arrangements of the components set forth in the following description or illustrated in the drawings. The Figures and written description are provided to teach any person skilled in the art to make and use the inventions for which patent protection is sought. The invention is capable of other embodiments and of being practiced and carried out in various ways. Those skilled in the art will appreciate that not all features of a commercial embodiment are shown for the sake of clarity and understanding. Persons of skill in the art will also appreciate that the development of an actual commercial embodiment incorporating aspects of the present inventions will require numerous implementation—specific decisions to achieve the developer's ultimate goal for the commercial embodiment. While these efforts may be complex and time-consuming, these efforts nevertheless would be a routine undertaking for those of skill in the art having the benefit of this disclosure.

In addition, it is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity in specific reference to the Figures and are not intended to limit the scope of the invention or the appended claims. Further, it should be understood that any one of the features of the invention may be used separately or in combination with other features. Other systems, methods, features, and advantages of the invention will be or become apparent to one with skill in the art upon examination of the Figures and the detailed description. It is intended that all such additional systems, methods, features, and advantages be included within this description, be within the scope of the present invention, and be protected by the accompanying claims.

As stated above, the present invention is directed to a backing plate or a polymeric substrate, wherein the backing plate or a polymeric substrate is coated with a chromium-based reflective coating. The backing plate or a polymeric substrate and the chromic-based reflective coating may be at least in part permeable to light originating from at least one light element.

Figure 2:
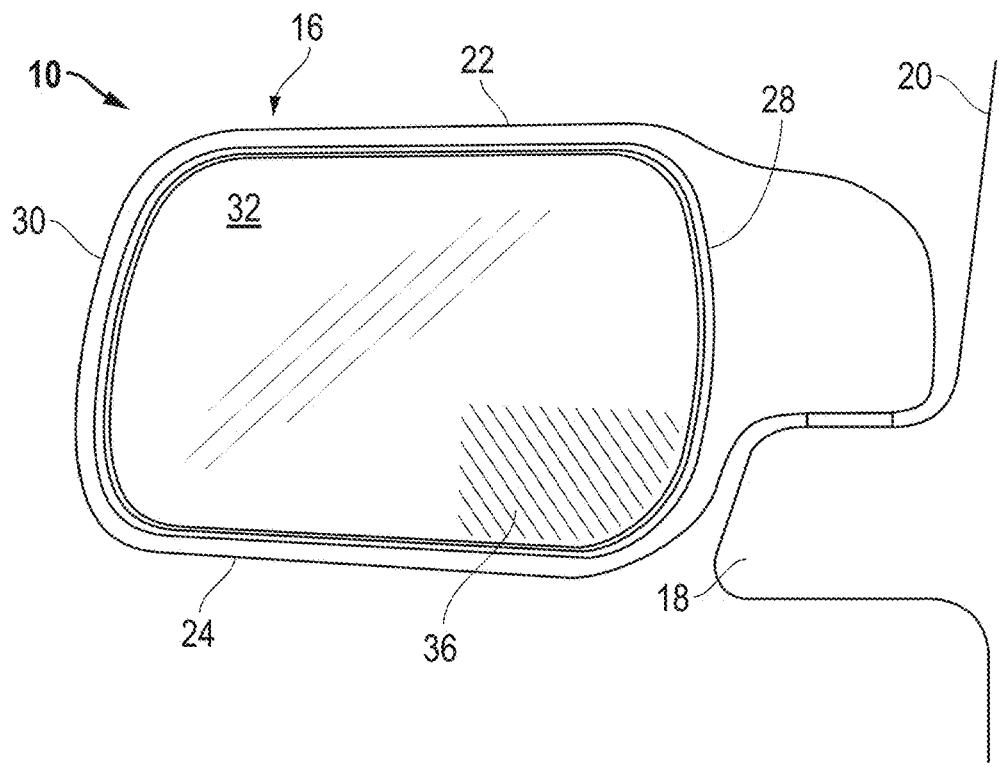
FIG. 2 is a front view of the mirror assembly of FIG. 1.
Figure 3:
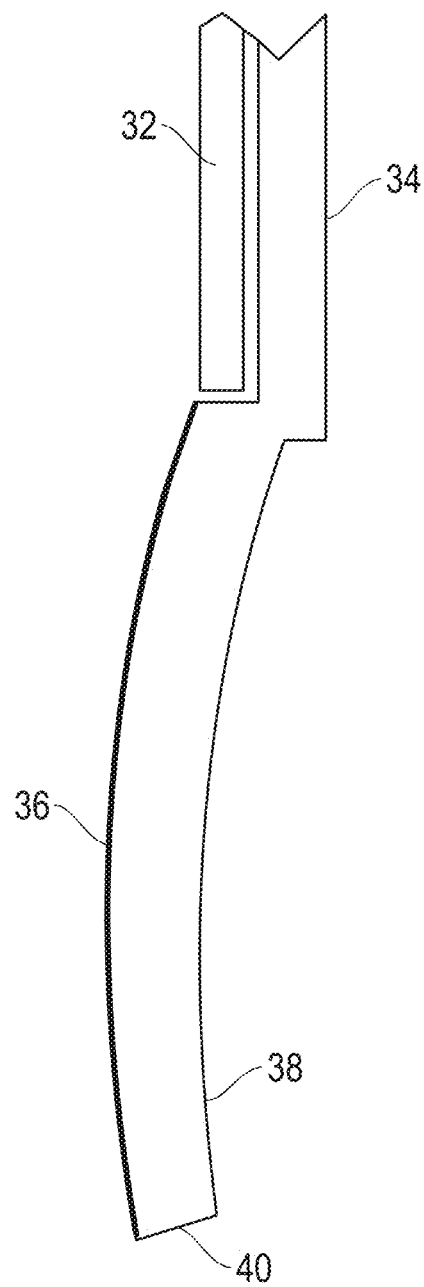
FIG. 3 is a cross-sectional view of the mirror assembly of FIGS. 1 and 2 having a reflective coating applied to a surface of the backing plate.

Referring to the embodiment illustrated in FIGS. 1-3, there is shown an exterior rear view mirror assembly indicated generally at 10 installed on the door 12 of a motor vehicle 14. Mirror assembly 10 is of the typical breakaway design and includes a housing 16 pivotally supported on an arm 18 extending outwardly from a generally triangular shaped mounting plate 20. Preferably, two mirror assemblies 10 will be mounted on vehicle 14, one of each side thereof to provide rearward and sideward fields of view with respect to the vehicle for the driver.

Housing 16 may be of any desired shape and includes an upper wall portion 22, a lower wall portion 24, a forwardly facing wall portion 26, an inner wall portion 28, and an outer wall portion 30, all of which merge smoothly together so as to present a pleasing appearance. The rearwardly facing portion of housing 16 is open and adapted to receive a reflective element 32. First, reflective element 32 is preferably a flat mirror to provide a generally unaltered field of view to the user. A suitably shaped support member or multi-function backing plate 34 is secured within housing 16 and serves to movably support reflective element 32 within the opening. Reflective element 32 may be implemented upon a glass or plastic substrate, each substrate receiving a reflective coating in accordance with techniques described in this application and any other techniques known to those skilled in the art.

In addition to reflective element 32, support member or multi-function backing plate 34 also includes a reflective coating 36 that is applied directly to a surface thereof. In this example, the reflective coating 36, which is also acting as a spotter mirror, is positioned in the bottom right corner of the mirror. It should be appreciated that any position can be used for the reflective coating 36 including the top right corner, the bottom left corner, and, most preferably, the top left corner of the mirror. In accordance with one aspect of the present invention, support member or multi-function backing plate 34 is a multi-function backing plate in which the backing plate structure performs more than one function. As is described in U.S. Pat. No. 7,080,913 to Paul R. Henion, et al., which is incorporated herein by reference in its entirety for all purposes, a multi-function backing plate may support standard and wide angle reflective elements as well as various light structures. The reflective coating 36 may be configured to provide a mirror image like that of a spotter mirror or fisheye mirror and preferably provides a wide angle of view of the area rearward and sideward of the vehicle. The reflective coating 36 is preferably a convex shape and applied to a surface of the multi-function backing plate 34 having a convex shape to provide the desired wide angle field of view.

As best seen in FIG. 3, the reflective coating 36 is applied to a multi-function backing plate 34. Multi-function backing plate 34 preferably includes an integral coating support section 38 which is shaped to a desired shape upon which the reflective coating 36 is applied. Because the reflective coating 36 is applied over the coating support section 38, the curvature of the coating support section 38 determines the curvature of the reflective coating 36.

Multi-function backing plate 34 may include suitable drive motors and the like for remote control adjustment of reflective element 32 and the portion of the backing plate supporting reflective coating 36 as well as appropriate heating elements to provide defogging and deicing capabilities.

It should be appreciated that a number of different coating compounds are described throughout the present description and that the present invention includes a reflective coating as described herein and below. However, it should also be appreciated that this invention is not limited to such coatings and any reflective coating may be used. For example, a coated backing plate in accordance with the embodiment illustrated in FIGS. 1-3 may be coated by any type of reflective coating not limited to the coatings described herein. In addition, it should be appreciated that a number of different examples of mirrors having coated backing plates are also included in the present invention. For example, reflective element 32 may be replaced by a reflective coating applied on a surface of the backing plate 34 and reflective coating 36 may be a mirror substrate mounted to the backing plate 34. Also, both mirrors may be reflective coatings that are applied to a surface of the backing plate 34. In another example, both reflective element 32 and reflective coating 36 may have the same flat configuration so that the coating support section 38 is not convex, concave or curved. In another example, the reflective element 32 may be a curved mirror having a same, similar, or different curved configuration of the curved coating support section 38 of the backing plate 34.

Figure 4:
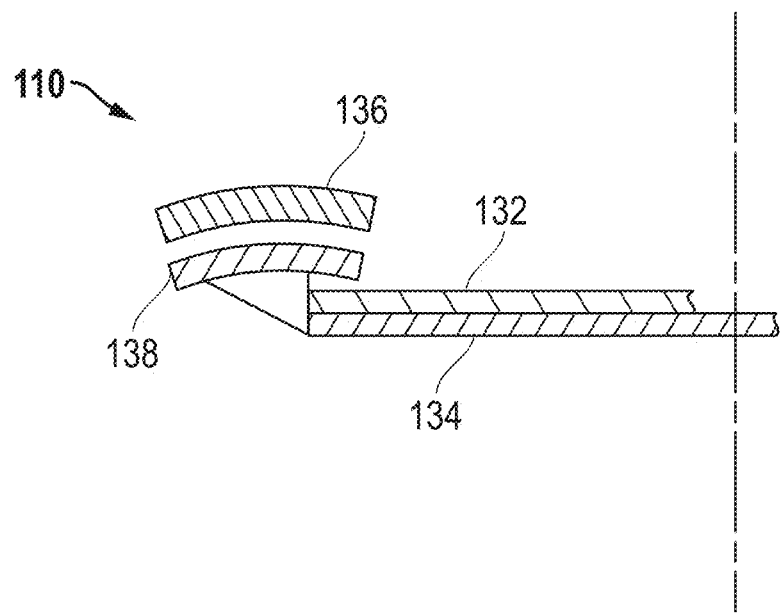
FIG. 4 is a diagram illustrating another embodiment of a rear view mirror assembly or side view mirror assembly having a backing plate for mounting a main mirror and including a support for a reflective mirror or coating that is directly coated to a surface of the backing plate support.

FIG. 4 is a diagram illustrating another embodiment of a rear view mirror assembly or side view mirror assembly 110 having a backing plate 134 for mounting a main mirror or coating 132 and a reflective mirror or coating 136 that is directly coated to a surface of the backing plate 138.

Referring to FIG. 4, a reflective element or a reflective coating 132 is applied to a multi-function backing plate 134. The backing plate 134 of this example includes a main mirror supporting section of the backing plate 134 and a spotter mirror supporting section 138 which are separated by a portion that elevates the spotter mirror supporting section 138 above and overlapping with the main mirror supporting section of the backing plate 134. The spotter mirror supporting section 138 and the reflective element or coating 136 supported by it are overlapping the main portion of the backing plate 134 and the reflective element or coating 132. The multi-function backing plate 134 preferably includes a spotter mirror supporting section 138 which is shaped to a desired shape upon which the reflective element or reflective coating 136 is applied. Because the reflective element or coating 136 is applied over the coating support section 138, the curvature of the coating support section 138 determines the curvature of the reflective coating 136. It should be appreciated that FIG. 4 is an example illustrating a reflective element 136 that is directly attached to the spotter mirror supporting section 138 but that a reflective coating 136 may be applied directly to the surface of the spotter mirror supporting section 138.

Multi-function backing plate 134 may include suitable drive motors and the like for remote control adjustment of reflective element 132 and the portion of the backing plate supporting reflective element or coating 136 as well as appropriate heating elements to provide defogging and deicing capabilities.

Figure 5:
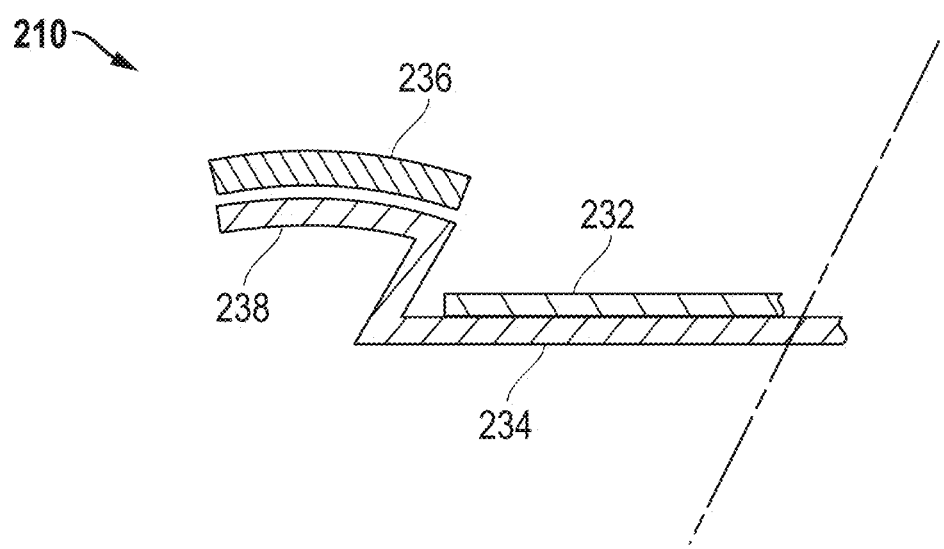
FIG. 5 is a diagram illustrating yet another embodiment of a rear view mirror assembly or side view mirror assembly having a backing plate for mounting a main mirror or coating and a reflective mirror or coating that is directly coated to a surface of the backing plate.

FIG. 5 is a diagram illustrating yet another embodiment of a rear view mirror assembly or side view mirror assembly 210 having a backing plate for mounting a main mirror or coating and a reflective mirror or coating that is directly coated to a surface of the backing plate.

Referring to FIG. 5, a reflective element or coating 232 is applied to a multi-function backing plate 234. The backing plate 234 of this example is formed using a main direction tool that is positioned at an angle with the normal axis and in the direction illustrated in FIG. 5. It should be appreciated that this method of making the mirror 210 is in contrast to the mirror 110 illustrated in FIG. 4 which is forced using a main direction tool that is positioned along the normal axis.

For the mirror 210 of FIG. 5, the arrangement of the main direction tool causes the spotter mirror supporting section 238 to overlap the main mirror supporting section of the backing plate 234. The multi-function backing plate 234 preferably includes a spotter mirror supporting section 238 which is shaped to a desired shape upon which the reflective element or reflective coating 236 is applied. Because the reflective element or coating 236 is applied over the coating support section 238, the curvature of the coating support section 238 determines the curvature of the reflective coating 236. It should be appreciated that FIG. 5 is an example illustrating a reflective element 236 that is directly attached to the spotter mirror supporting section 238 but that a reflective coating 236 may be applied directly to the surface of the spotter mirror supporting section 238.

Multi-function backing plate 234 may include suitable drive motors and the like for remote control adjustment of reflective element 232 and the portion of the backing plate supporting reflective coating 236 as well as appropriate heating elements to provide defogging and deicing capabilities.

Figure 6:
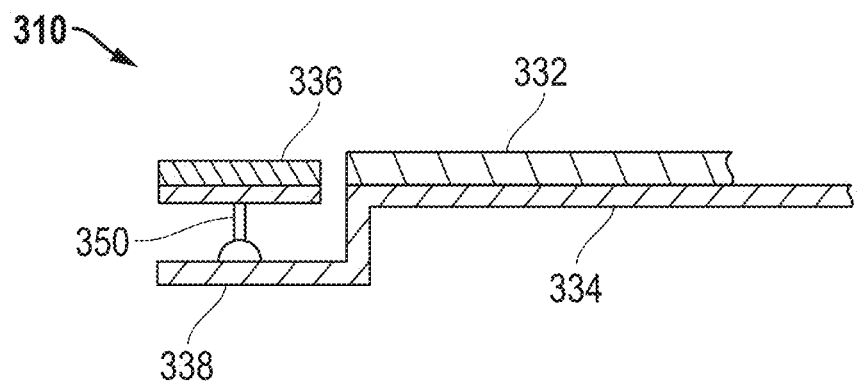
FIG. 6 is a diagram illustrating a further embodiment of a rear view mirror assembly or side view mirror assembly having a backing plate for mounting a main mirror or coating and a reflective mirror or coating that is directly coated to a surface of an actuator of the backing plate.

FIG. 6 is a diagram illustrating a further embodiment of a rear view mirror assembly or side view mirror assembly having a backing plate for mounting a main mirror or coating and a reflective mirror or coating that is directly coated to a surface an actuator of the backing plate.

Referring to FIG. 6, a reflective element or a reflective coating 332 is applied to a multi-function backing plate 334. The backing plate 334 of this example includes a friction ball or actuator 350 for supporting and adjusting the spotter mirror that is positioned at the spotter mirror supporting section 338. The reflective element or reflective coating 336 is applied directly to the friction ball or actuator 350 so that it is independently adjustable from the reflective element or coating 332 of the main mirror. Because the reflective coating 336 is applied over the coating support section of the actuator 350, the curvature of the support section of the actuator 350 determines the curvature of the reflective coating 336.

In addition to actuator 350, multi-function backing plate 334 may include suitable drive motors and the like for remote control adjustment of reflective element 332 and the portion of the backing plate supporting reflective coating 336 as well as appropriate heating elements to provide defogging and deicing capabilities.

Figure 7:
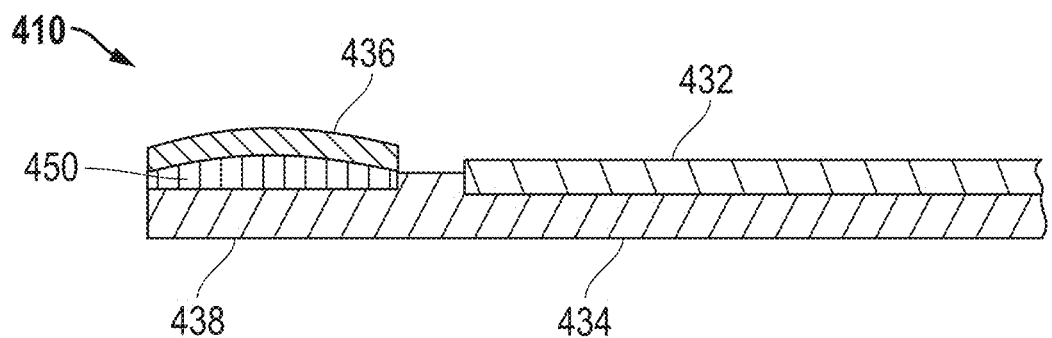
FIG. 7 is a diagram illustrating another embodiment of a rear view mirror assembly reflective mirror or coating that is directly coated to a surface of an intermediate support on the backing plate.

FIG. 7 is a diagram illustrating another embodiment of a rear view mirror assembly or side view mirror assembly having a backing plate for mounting a main mirror or coating and a reflective mirror or coating that is directly coated to a surface of the backing plate.

Referring to FIG. 7, a reflective element or a reflective coating 432 is applied to a multi-function backing plate 434. The backing plate 434 of this example is flat at the main mirror support portion 434 and the spotter mirror supporting portion 438. The backing plate 434 holds an intermediate support 450 that is flat at one side facing the spotter supporting portion 438 and curved at the other side for supporting a curved reflective element or reflective coating 436. Because the reflective element or reflective coating 436 is applied directly to the intermediate support 450, the curvature of the intermediate support 450 determines the curvature of the reflective coating 436.

Multi-function backing plate 434 may include suitable drive motors and the like for remote control adjustment of reflective element 432 and the portion of the backing plate supporting reflective coating 436 as well as appropriate heating elements to provide defogging and deicing capabilities.

Further to the above described examples illustrated in FIGS. 1-7, preferred dimensions for the radius of curvature may vary between the curved mirror and a substantially flat mirror. For example, to achieve a wider field of view, the curved mirror may have a radius of curvature that is between 0 mm and 1,300 mm. The flat mirror may be entirely flat or may be slightly curved having a significantly larger radius of curvature. In addition, a flat mirror includes a mirror which provides a user with a one to one ratio of magnification. That is, the viewed image may be the same dimensions as the actual image with a 2% plus or minus degree of distortion.

In addition, as described in multiple embodiments above, the curved mirror may be tilted with respect to the flat mirror, or the flat mirror may be tilted with respect to the curved mirror. Also, both mirrors may be selectively adjustable by an actuator or manually by a user, being both adjustable together and separately with respect to one another. The preferred positions for the angle of the one mirror, for example the curved mirror, with respect to the other mirror, for example the flat mirror, is between +40 degrees and −40 degrees outwardly, inwardly, upwardly, or downwardly. As used herein, the terms outwardly refers to tilting the mirror away from the door of the vehicle, inwardly refers to tilting the mirror toward the door of the vehicle, upwardly refers to tilting the mirror toward the sky, and downwardly refers to tilting the mirror toward the surface of the road.

In one embodiment of the present invention, a vehicle component such as a rear view device could comprise the backing plate or a polymeric substrate coated with the chromium-based reflective coating. The at least one light element could be any light source suitable for this purpose. In one embodiment the at least one light element is a LED lamp and could be arranged directly on the substrate. For example, this could be done by any means suitable for attaching the light element to the polymeric substrate, such as adhesives, screws, by welding or the like. Alternatively, the light source could be arranged close to the substrate, i.e. in the proximity of the substrate. For example, the light source could be arranged on the inside of a housing of a rear view device comprising the polymeric substrate and light originating from the LED lamp could shine through the polymeric substrate and through the chromium-based reflective coating. Advantageously, a component of a vehicle, or at least part of the component can serve as an ambient light source.

In one embodiment of the present invention the polymeric substrate is comprised by a housing for a side turn indicator of a rear view device of a vehicle with the side turn indicator comprising at least one light element.

The polymeric housing could be part of a housing of a rear view device of a vehicle, preferably of a motor vehicle, such as a car, a bus, a van, a motorcycle or the like. However the polymeric housing could also accommodate the back view element of the rear view device as well as the required components to move the back view element. The back view element could be for example a mirror made of glass, or a visual mirror comprising an electronic display. The polymeric housing could be arranged so that it is orientated towards the driving direction of the car to signal the drivers intention to change direction to the oncoming traffic.

The polymeric housing also comprises at least one first side turn indicator. Generally, the at least one first side turn indicator may have any possible form and may be positioned in any direction which is desired due to technical reasons, design reasons or legal reasons. For example, the at least one first side turn indicator could be substantially elongated and could be arranged in the polymeric housing so that it is aligned substantially parallel to the street. Here, the term "substantially parallel" defines that the side turn indicator is arranged in the housing so that it is orientated horizontally to the driving direction. The polymeric housing could also comprise more than just one side turn indicator, such as two side turn indicators, three side turn indicators or even more. For example, the polymeric housing could comprise a second side turn indicator that points away from the driving direction so that the on and off states of the driving indicator are also signalized to the driver of the vehicle.

In one embodiment of the invention the at least one light element in the form of a side turn indicator is incorporated into the polymeric housing by over-moulding the side turn indicator with the polymeric material of the housing. Here, the terms over-moulding and co-moulding can be used interchangeably to refer to the incorporation of at least part of the side turn indicator into the polymeric material of the polymeric housing. Advantageously, the side-turn indicator can be fully sealed in the polymeric housing so that it is not visible from the outside of the polymeric housing. However, when the indicator is activated, light originating from the side-turn indicator can shine through the polymeric housing (i.e. the polymeric substrate and the chromium-based reflective coating) to signalize the drivers intention to change direction. Here, the term "shine through" can be used to define that the material of the polymeric housing is at least in part permeable to light. Therefore, the side-turn indicator can be located closely beneath the material surface. This way of integrating the side turn indicator is especially suitable when space constraints and exterior surface constraints need to be observed.

In another embodiment of the invention, the side turn indicator is incorporated into an opening in the surface of the polymeric housing that is closeable with a lid comprising the same material than the polymeric housing and being coated with the chromium-based reflective coating. Instead of over-molding the side turn indicator, the side turn indicator can also be integrated in an opening in the polymeric housing. Here, the side turn indicator can be connected to the polymeric material by means of screws, welding, and/or by means of an adhesive. The opening can then be closed by the lid comprising the same material than the polymeric housing and being coated with the chromium-based reflective coating, so that light originating from the side turn indicator can shine through the lid.

In one embodiment of the invention, the side turn indicator comprises a polymeric light pipe, preferably a light pipe comprising a clear polymeric material. The clear polymeric material may be selected from the group consisting of polyacrylate, such as poly(methyl methacrylate) (PMMA), polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these. Preferred substrate materials include polycarbonate, poly (2,2'-dihydroxyphenylpropane) carbonate, polydiethyleneglycol bis(allyl carbonate), polymethylmethacrylate and polystyrene, or blends thereof. In one embodiment the light pipe is made from PMMA. Here, the term "light pipe" can be used to refer to a tubular structure that is adapted to transport light. Light might be coupled into the light pipe at one, or at both ends of the light pipe. The light is then being radiated from the light tube along its length, or at least along part of its length. The light pipe could also comprise reflecting elements so that light is directed into the driving direction of the vehicle. Here, in this example, the light pipe could be over-molded by the polymeric material of the housing. Also, the interior and/or exterior surface of the light pipe could comprise at least in part an optic pattern. By employing such a pattern, certain illumination effects can be advantageously achieved.

The light source may be any suitable light source applicable for the intended purpose. In one embodiment of the invention, the polymeric light pipe comprises at least one LED lamp to illuminate the light pipe. Here, the at least one LED lamp could be arranged at one end of the light pipe, to radiate light into the light pipe. The light is then radiated away from the light pipe along the length of the light pipe as described above. Preferably, two LED lamps are employed, where at each end of the light pipe one LED lamp is located. The LED lamps could be arranged in the polymeric housing so that they are easily accessible from the inside of the polymeric housing. Advantageously, the at least one LED lamp can be easily replaced in such a arrangement.

In one embodiment of the invention, the at least one polymeric light pipe is adapted to sequentially radiate the light from the at least one LED lamp. In the description the term "sequentially" can be used to refer to a light sweep effect. For example, light might sweep from the centre of the vehicle outwards to promote direction of travel, where the light has the appearance of a continuous even illumination. Therefore, the polymeric light pipe could comprise reflecting and/or diffusing elements for creating the light sweep effect.

One embodiment of the invention relates to a rear view device of a vehicle comprising a polymeric substrate according to the invention. In one specific embodiment of the invention the rear view device comprises a surface having a metallic appearance that is realized by the coated polymeric substrate. In one specific embodiment of the invention a side turn indicator is arranged below the surface having a metallic appearance or comprises at least part of said surface having the metallic appearance. In one specific embodiment of the invention light originating from a light source of the side turn indicator shines through the surface of the polymeric substrate having a metallic appearance. In one specific embodiment of the invention light originating from the light source of the side turn indicator sweeps in one direction, like from a center outwards, to indicate a direction of travel. In one specific embodiment of the invention the light front is moving in said direction.

Figure 14:
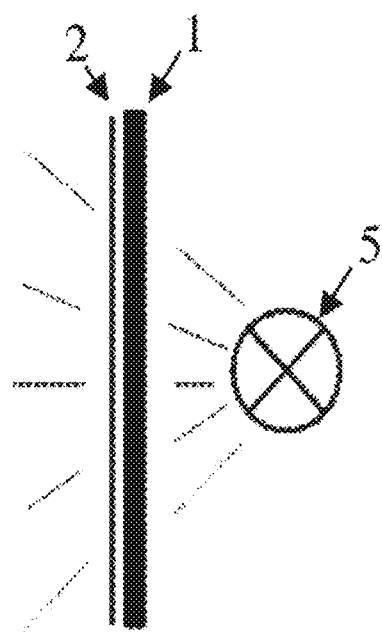
FIG. 14 shows a schematic view of a polymeric housing according to an example of the invention, and a LED lamp.

FIG. 14 shows a schematic view of a polymeric housing 1 according to an example of the invention, and a LED lamp 5. In the shown example, the LED lamp 5 is arranged on one side of the polymeric housing 1. The indicated light rays show that light originating from the LED lamp 5 can shine through the polymeric material of the housing 1 and through the chromium-based reflective coating 2 that is arranged on the polymeric housing 1.

Figure 15:
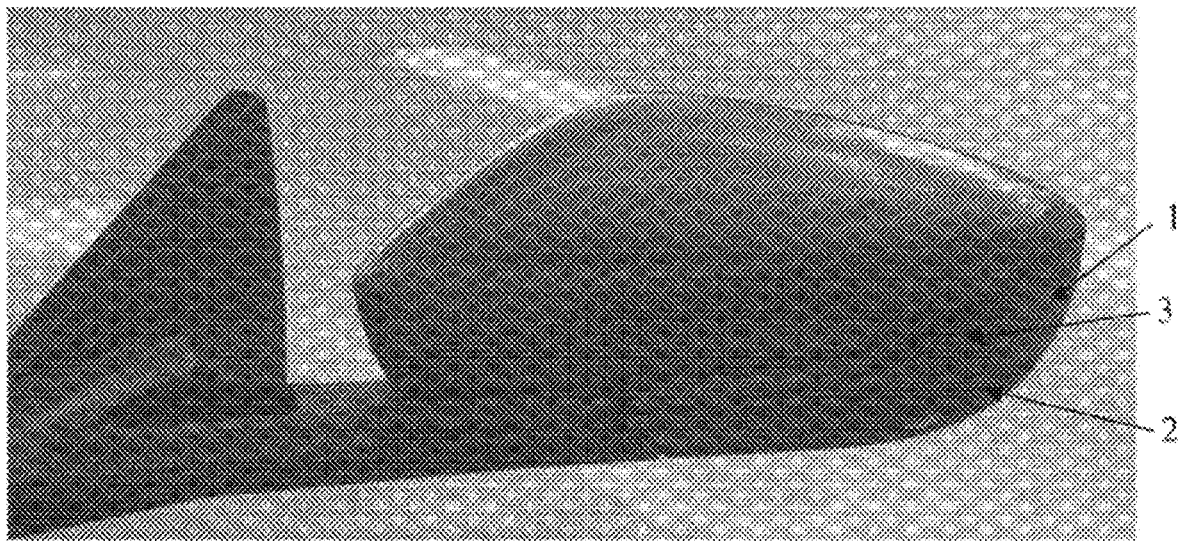
FIGS. 15 and 16 show schematic views of the polymeric housing for a side turn indicator being part of a housing of a rear view device of a vehicle according to an example of the invention with the side turn indicator activated and deactivated.
Figure 16:
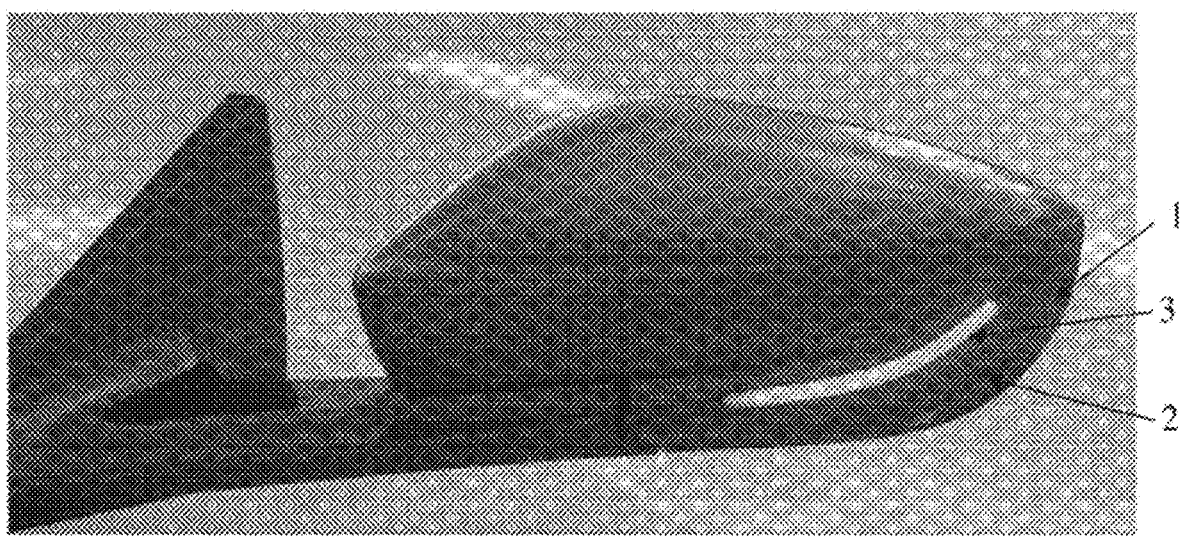

In FIGS. 15 and 16 schematic views of the polymeric housing 1 for a side turn indicator 3 are shown. In the shown example the polymeric housing 1 is part of a housing of a rear view device of a vehicle. In FIG. 15, the side turn indicator 3 is shown in the deactivated state. Therefore, by merely looking at the outside of the polymeric housing 1 no indication is given that a side turn indicator 3 is arranged at the inside the polymeric housing 1. FIG. 16 shows the side turn indicator 3 in the activated state, where light originating from the side-turn indicator 3 shines through the polymeric housing 1 and through the chromium-based reflective coating 2 to signalize the drivers intention to change direction.

In FIGS. 15 and 16 the polymeric housing 1 and the rear view device housing are shown as separate components. However, the skilled person would know that the polymeric housing 1 of the side turn indicator 3 could also accommodate the back view element of the rear view device.

Figure 17A:
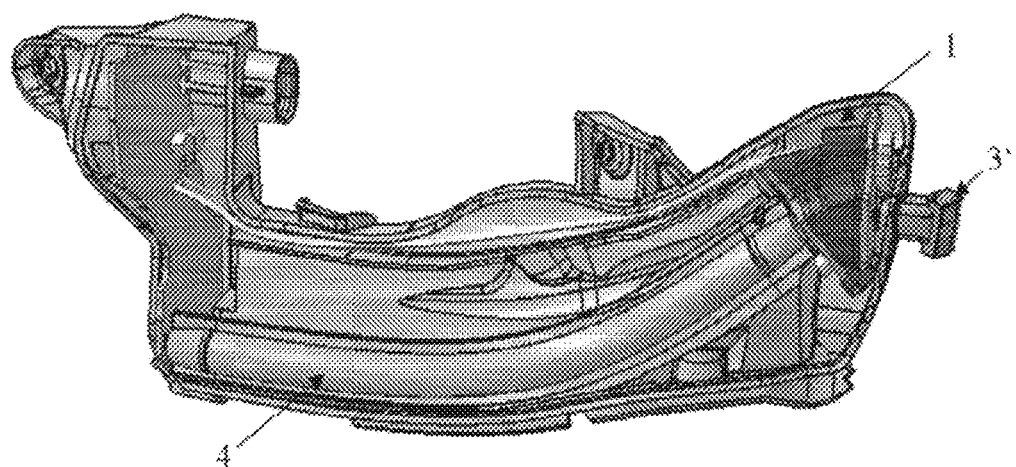
FIGS. 17a, 17b, and 17c show schematic views of the polymeric housing and a polymeric light pipe according to an example of the invention.
Figure 17B:
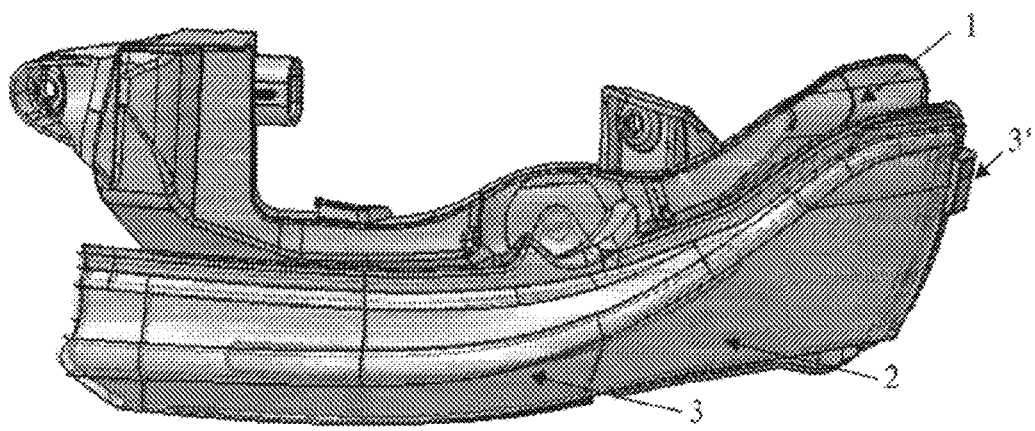
Figure 17C:
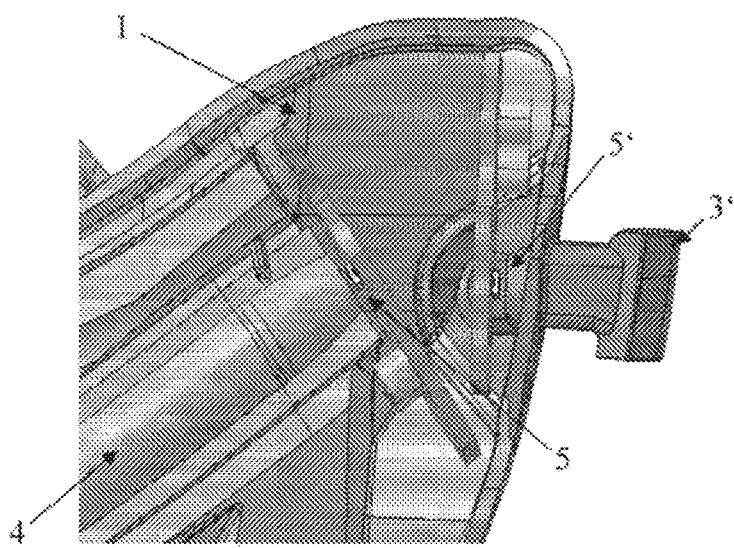

FIGS. 17A, 17B, and 17C show schematic views of the polymeric housing 1 and a polymeric light pipe 4 according to an example of the invention. In FIG. 17A the polymeric light pipe 4 is shown, the light pipe 4 has a tubular structure and is located essentially horizontally in the polymeric housing 1. In the shown example, light is coupled into the light pipe 4 by means of at least one LED lamp 5. In FIGS. 17A, 17B, 17C a second side turn indicator 3' is shown that also uses at least one LED lamp 5' and points away from the driving direction into the opposite direction of the vehicle. FIG. 17A shows the polymeric light pipe 4 being over-molded by the polymeric material of the polymeric housing 1.

In another example, the at least one side turn indicator comprises a plurality of LED lamps and a light reflector arrangement, wherein the plurality of LED lamps are adapted to sequentially illuminate the light reflector element. The plurality of LED lamps could be densely arranged along the entire length of the side turn indicator, e.g. one after another. A reflector arrangement could be arranged so that the light radiated from the LED lamps is reflected into the driving direction of the vehicle. Each LED of the plurality of LED lamps could be triggered by a microcontroller with enough outputs to drive each LED lamp individually. In this manner all LED lamps can be switched on at the same point of time, or shortly after another so as to create the sweep appearance. Alternatively, the plurality of LED lamps could be also triggered by shift register components which are driven by a single output of a microcontroller. The microcontroller could be also logically linked with the vehicle front turn signal, such that if the front turn signal is not operational then the plurality of LED lamps in the at least one side turn indicator are not triggered.

In another example, the at least one side turn indicator comprises a plurality of LED lamps and a light diffusing element, wherein the plurality of LED lamps are adapted to sequentially illuminate the light diffusing element. Advantageously, all LED lamps from the plurality of LED lamps can illuminate a common diffusing element from one edge, allowing a level of overlap in output to give a smoother sweep appearance. As described above, the plurality of LED lamps can be triggered by a microcontroller having a sufficient amount of outputs and/or by shift register components which are driven by a single output of the microcontroller.

Figure 18:
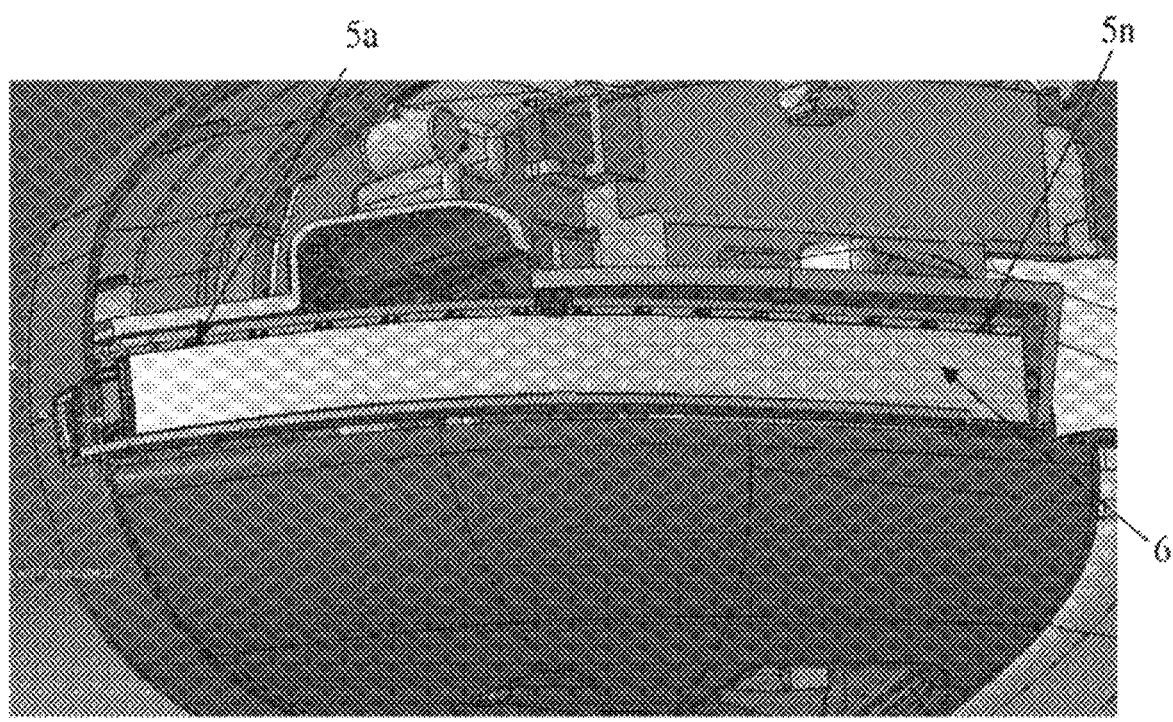
FIG. 18 shows a schematic view of a housing comprising a side turn indicator having a plurality of LEDs and a light diffusing element according to an example of the invention.

FIG. 18 shows a schematic view of a housing comprising a side turn indicator having a plurality of LED lamps 5a, ..., 5n and a light diffusing element 6 according to an example of the invention. In the shown example, the side turn indicator comprises 14 LED lamps 5a, ..., 5n that are all arranged horizontally in a single row and separated from each other by an equal distance. Arranged below is a light diffusing element 6 that is shown to be slightly tilted and which is illuminated from the LED lamps 5a, ..., 5n on one of its edges, allowing a level of overlap in output to provide a smoother sweep appearance.

Examples—Physical Properties of the Coating

Experiments were conducted to form various coatings in accordance with the present invention upon polymeric substrates. In these experiments, specially prepared polymeric substrates were utilised, which themselves included coatings applied directly thereupon. Indeed, the polymeric substrates were a polycarbonate material (approximately 8 cm×8 cm squares of 0.5 cm thickness) coated with a hardcoat resin (PHC587B from Momentive Performance Materials Inc., TSR2626B from SDC Technologies Inc., or PR660/MP101 from SDC Technologies Inc.), the hardcoat then itself coated with a reactively sputtered $SiO_2$ layer.

The polymeric substrate was dip-coated at a withdrawal speed of 11 mm/s, or spin-coated at 300 revolutions per minute (rpm) for 5 seconds, and cured as per the manufacturers prescribed conditions, to thereby form the hardcoat resin layer upon the polymeric substrate. For the $SiO_2$ layer, a custom-built reactor was used to sputter a high purity Si target in an $Ar+O_2$ environment. The hardcoat resin layer and the $SiO_2$ layer had thicknesses of 5 μm and 140 nm respectively, as determined using a F20 Thin Film Analyzer by Filmetrics Inc.

The chromium-based reflective coating of the present invention was subsequently applied to the specially prepared polymeric substrates in a custom-built reactor by magnetron co-sputtering a $CrM_x$ alloy layer (where M=the hcp transition metals Zr and Co), to form a range of exemplified samples. In addition, comparative samples were prepared where M=the bcc transition metal molybdenum (Mo).

The substrates were heated to 85° C. using an infrared lamp in the custom-built reactor as the chamber was evacuated to approximately $1 \times 10^{-4}$ mbar. A co-sputtering process employing two sputter targets was used to deposit the $CrM_x$ alloy layer. The substrate holder was rotated at 60 rpm through the respective plasma's generated from a 5"×12" rectangular high purity Cr target and a 3" disc dopant material target. A sample rotation speed of 60 rpm was chosen because each pass through the plasma was calculated to deposit approximately 4 to 6 Angstrom of combined material from the targets, thus avoiding a sandwich type layer structure and achieving the preferred binary alloy coating.

A working gas of Ar was introduced at flow rates of 80 standard cubic centimeters per minute (sccm). For deposition, the Cr target was set at a constant power of 1 kW, while the dopant material target was set within the range of 25 to 100 W to define the experimental window for neutral colored abrasion resistant alloy coatings. The final reflective coating for the samples had a $CrM_x$ film thickness in the order of 40 to 60 nm as determined by Atomic Force Microscopy imaging. The Cr:M ratios within the coatings of the samples were generated by changing the dopant material (M) deposition rate relative to the Cr, with the actual ratios achieved determined using X-ray Photoelectron Spectroscopy (XPS) analysis (Kratos Axis Ultra DLD with an Al-Kα monochromatic source).

Figure 8:
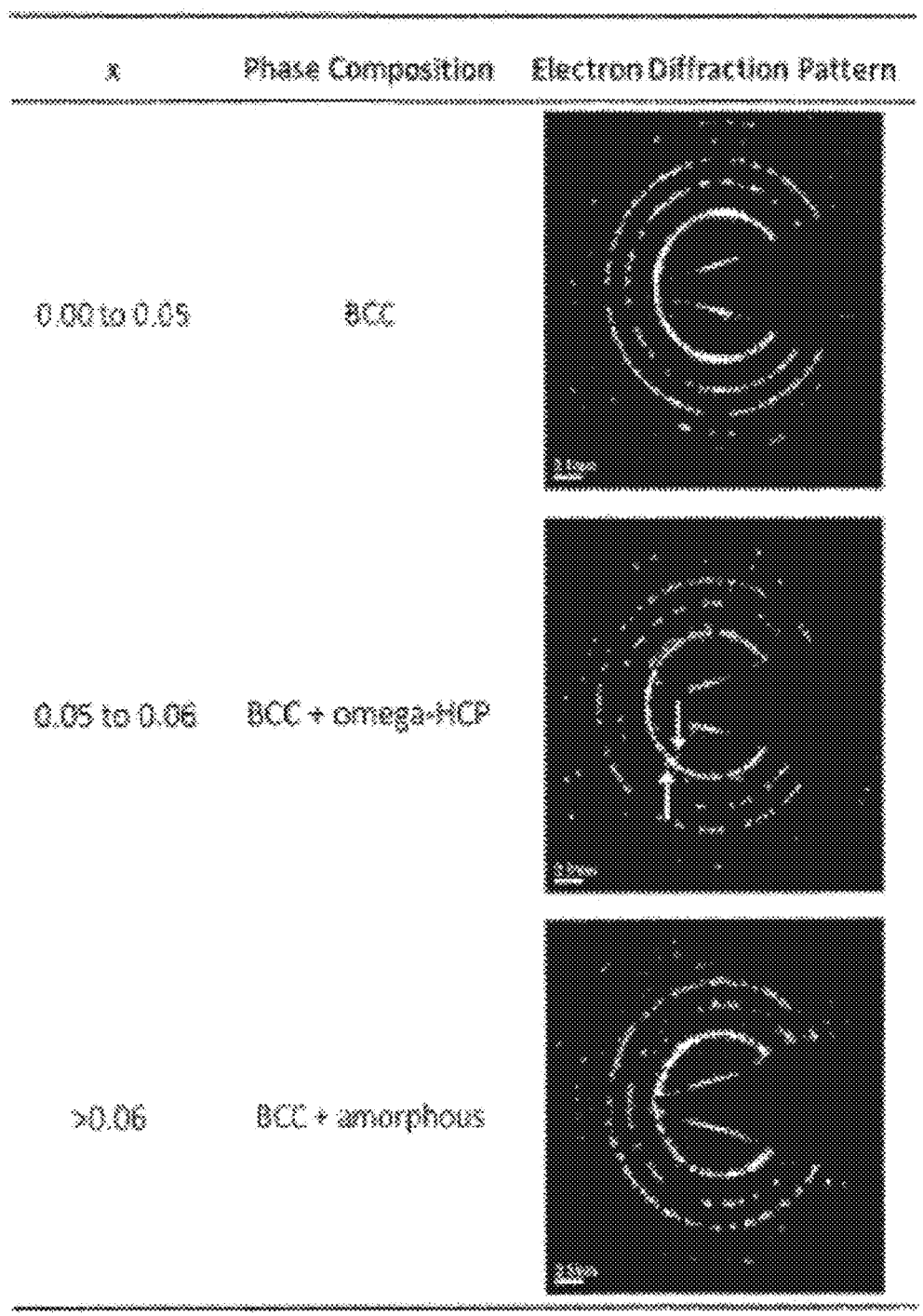
FIG. 8 shows the phase composition of a $CrZr_x$ coating as a function of its elemental composition—the presence of the Ω-hcp is represented by the diffraction highlighted with the arrows.

The elemental composition, defined by x, of the ultrathin $CrM_x$ films was determined for each of the samples—see Table 1 (for Zr) and Table 2 (for Co) below for the collected data. With Zr used as the dopant material M, as the ratio between the power density applied to the Zr and Cr targets increased, there was a near linear increase in the Zr concentration in the ultrathin film. For each of the Zr samples the electron diffraction pattern was collected using TEM (see FIG. 8), and then analysed with respect to the major constituents within the film. The spot size of the electron beam was minimised to produce the clearest diffraction patterns possible for these polycrystalline ultrathin films (polycrystalline with respect to the small grain-like/columnar structures that constitute the film).

From the electron diffraction analysis of the $CrZr_x$ films, two transition concentrations are defined that represent the change from one phase composition to another. These transitions are at x=0.05 (bcc to bcc+Ω-hcp) and 0.06 (bcc+Ω-hcp to bcc+amorphous). The Ω-hcp phase is a displacive phase transformation from the bcc structure.

Figure 9:
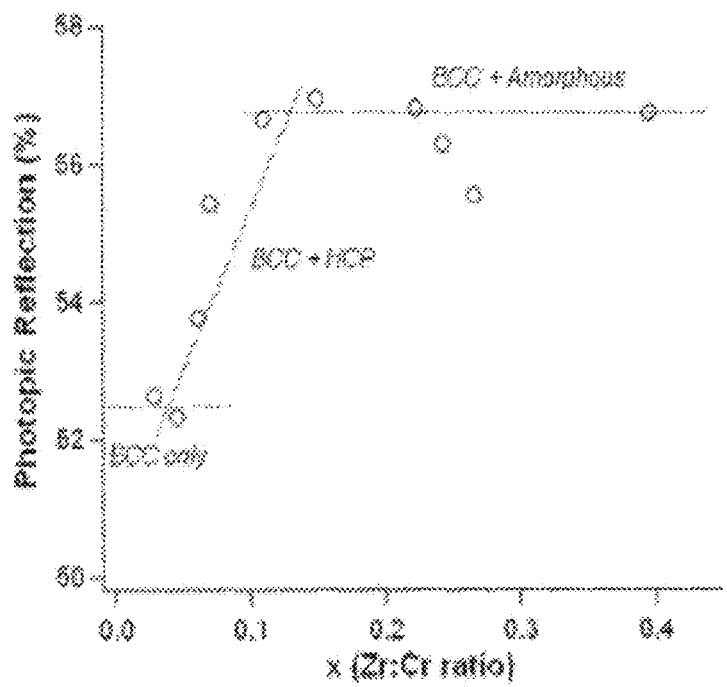
FIG. 9 shows the photopic reflectivity of a $CrZr_x$ coating as a function of the elemental composition—the optical reflectivity of the coating follows its phase composition.

The optical properties of each sample were determined using a HunterLab UltraScan Pro instrument. These optical measurements were quantified by the CIELAB color model. A "neutral" color is reference to a color that is defined by measured L*, a* and b* values in accordance with the 1976 CIE L*a*b* Space (or CIELAB) color model, which is an approximately uniform color scale organised in cube form. In the orthogonal a* and b* color axes, positive a* values are red, negative a* values are green, positive b* values are yellow and negative b* values are blue, while the vertical scale for lightness (or greyscale) L* runs from 0 (black) to 100 (white), allowing the positioning of a total color E in three points. The Chroma (C*) of the color is defined as $\sqrt{(a^{*2}+b^{*2})}$, and is used to quantify the magnitude of the color independent of its lightness. Ideally, for the color E to be neutral, the C* value will be less than or equal to 1 and the color E will thus be close to the neutral L* axis. Here, it is quantified by measures of a* and b* (as mentioned above) which embody the color or chroma ($C^*=\sqrt{(a^{*2}+b^{*2})}$) of the captured light, be it transmitted or reflected. Also, the total photopic reflectivity (R %) of the coatings was measured. With reference to Tables 1 and 2 and FIG. 9, the reflectivity was observed to change over the elemental composition range presented. More so, the optical response followed that of the phase composition of the film with observed discontinuities in the reflectivity versus elemental composition at the transition concentrations defined from the electron diffraction assignment.

Further to this change in reflectivity, at lower concentrations of Zr a maxima and minima was observed in the reflectivity as a function of photon energy. Indeed, measurement of the photon energy for the maxima and minima yielded 2.5 and 2.2 eV respectively, at concentrations up to $CrZr_x$=0.11. At these energy levels the observed maxima is assigned to electron transitions from the filled d-orbital bands to the empty d-orbital bands of the atoms, namely the 3→5 transition. From the electron diffraction images, the crystal structure in this concentration range was representative of the bcc structure for Cr.

The loss of the maxima and minima in the reflectivity correlates with the transition from the purely crystalline alloy films (bcc and bcc+Ω-hcp) to the crystalline plus amorphous. It is believed that in the amorphous phase the higher concentration of Zr yielded partially filled d-orbital bands of the CrZr$_x$ structure through orbital hybridization. Increased filling of the orbitals removed the d-orbital interband transitions because they were then occupied. The electron transitions that occured in the electronic structure of the atoms then occured at energies outside of the visible spectrum (>3.5 eV). As the d-orbtial transitions were reduced and eliminated by increasing the Zr concentration, the yellow part of the visible spectrum (ca 2.15 eV) increased in reflectivity relative to the other energy regions. Thus, the samples changed in their color intensity (chroma) from neutral to yellow when the elemental composition of Zr increased, as is apparent from FIG. 10.

Figure 10:
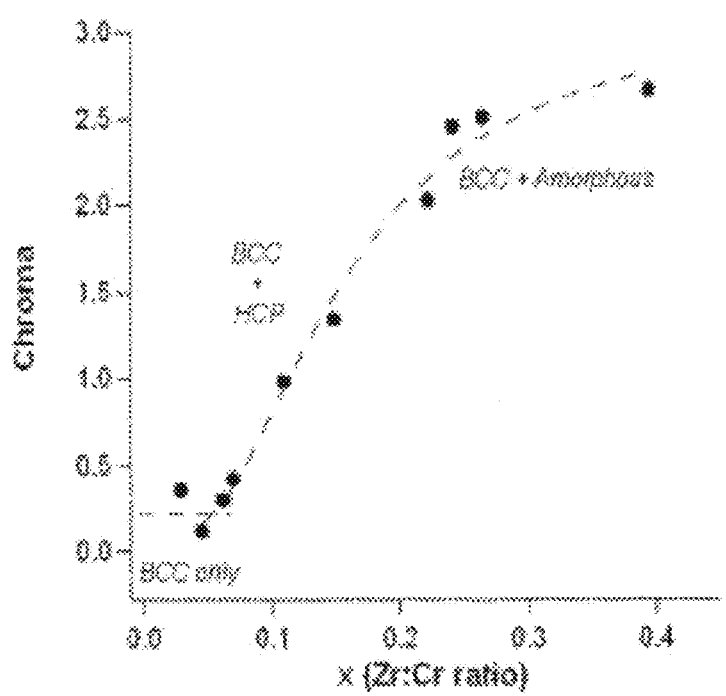
FIG. 10 shows the reflected chroma of the thin film coating as a function of the elemental composition of a $CrZr_x$ coating—chroma embodies the magnitude of the color relative to neutral, but not the specific color observed; the transitions between phases are not likely to be discrete at a given concentration.

Indeed, unlike the reflectivity, the chroma of the ultrathin film did not show a change in trend at the transition concentration between crystalline to crystalline plus amorphous—see FIG. 10. At the transition concentration (x=0.05) where the additional Ω-hcp is observed, there is a transition in the C* value of the ultrathin films. This suggests the onset of the orbital hybridization in the electron structure occurs at concentrations of Zr close to x=0.05.

The abrasion resistance of the reflective coating of each sample was determined by employing the Bayer abrasion test. This test is employed in a variety of different industries to qualify the abrasion resistance of a coating, with the variant employed here being similar to the ASTM F735 standard for the determination of abrasion resistance of aircraft windows and ophthalmic lenses. A Taber Oscillating Abrasion Tester (model 6100) was used to subject the samples to 300 cycles (150 cycles/min) over a stroke length of 100 mm under an applied load of 0.5 kg of Alundum chips (Norton Company of Worcester Mass., USA). In this test, the abrasion resistance is quantified by the Bayer Ratio that takes account of the change in haze (or reflection haze for reflective substrates) of the sample from the abrasion, normalised against the change in haze observed for a reference sample (as per SAE J964). Haze is determined by:

$$Haze = (R\,\%_{SE}/R\,\%\,si) \times 100,$$

where R $\%_{SE}$ and R $\%_{SI}$ are the reflectivity with the specular beam excluded and included respectively.

Both the sample and the reference were tested for haze using the same HunterLab UltraScan Pro instrument used for the color and reflectivity measurements. In this study, the same type of reference material was used for determination of the Bayer Ratio (a piece of uncoated polycarbonate). The larger the determined Bayer Ratio, the greater the abrasion resistance relative to the reference sample. To reference the performance of the coating of the present invention, in situations where various pre-coating films were present as a part of the polymeric substrate, the abrasion resistance is compared to the Bayer Ratio for a chrome nitride (CrN) coating using the same pre-coated substrate, where the abrasion resistance of the CrN coating is defined as the acceptable level of abrasion resistance, and the acceptable level of abrasion resistance for embodiments of the present invention are then represented as an abrasion resistance (%) of 100%.

Again with particular reference to the samples having Zr as the dopant material M, the mechanical properties of the ultrathin CrZr$_x$ films were characterized by measurement of abrasion resistance. Importantly, it was recognised that the resistance to abrasion is not solely characterised by a Cr:Zr ratio, but also by the underlying layers in a multilayer structure. Therefore, in this experimental work, the specially prepared substrates were constant within a given sample, and hence relative variations in the mechanical properties could be assigned to changes in the ultrathin CrZr$_x$ coatings.

Figure 11:
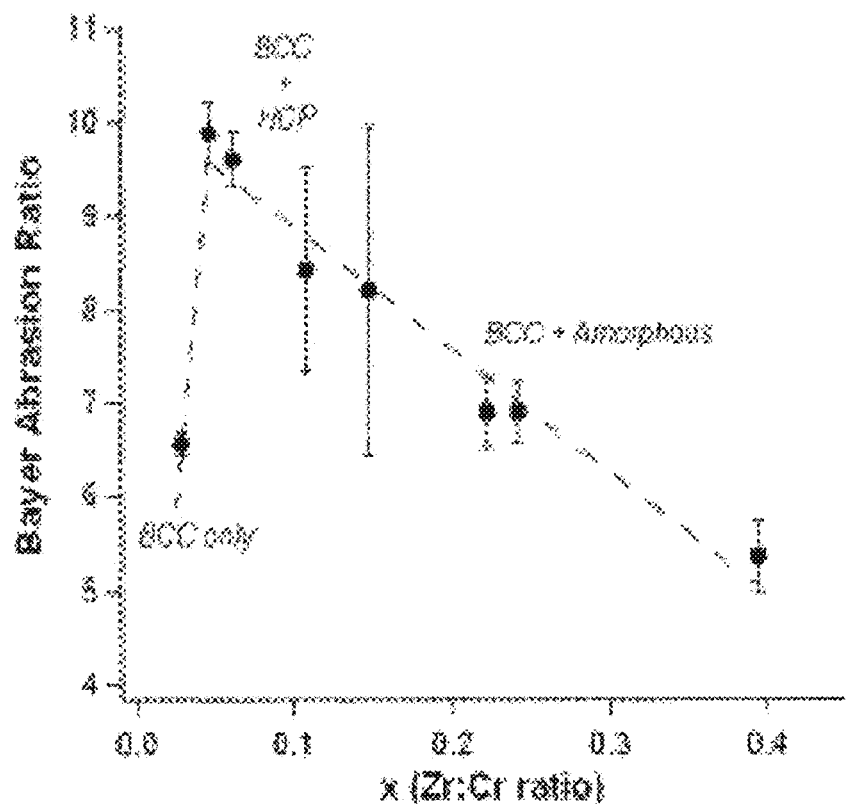
FIG. 11 shows the abrasion resistance of a $CrZr_x$ coating as a function of the elemental composition of the $CrZr_x$ coating.

The abrasion ratio determined by the Bayer abrasion test mentioned above is shown in Table 1 and FIGS. 11 and 13 for Zr as the dopant material, and in Table 2 and FIG. 13 for Co as the dopant material. For the purposes of comparative analysis the bcc transition metal Mo was used as the dopant.

Table 1 shows that there was an increase in the resistance to abrasion upon increasing the elemental composition of Zr. A maximum in the resistance to abrasion was observed immediately after the transition from bcc to the bcc+Ω-hcp, after which increasing the Zr concentration lead to a steady decrease in the measured abrasion ratio. Table 2 shows that the resistance to abrasion increased in line with the increase in elemental composition of Co, with the maximum abrasion resistance achieved prior to the transition from bcc+Ω-hcp to bcc+amorphous structure. For both of the dopants exemplified in Tables 1 and 2, the resistance to abrasion was greatest when the dopant was present at concentrations that resulted in a bcc+hcp structure.

TABLE 1

|  | CrN | CrMO | CrZr$_x$ | | | | |
| --- | --- | --- | --- | --- | --- | --- | --- |
| x | — | 0.06 | 0.03 | 0.05 | 0.06 | 0.11 | 0.15 |
| Atomic Percentage (%) | — | 5.8 | 2.8 | 4.4 | 5.8 | 9.8 | 12.9 |
| Crystal Structure | fcc | bcc | bcc | bcc + Ω-hcp | bcc + Ω-hcp | bcc + amorph | bcc + amorph |
| Abrasion Resistance (%) | 100.0 | 60.0 | 73.9 | 111.4 | 109.1 | 100.0 | 87.5 |
| Chroma | 4.1 | 0.21 | 0.4 | 0.1 | 0.3 | 1.0 | 1.4 |
| Reflectivity (%) | 55.5 | 50.5 | 52.7 | 52.5 | 53.8 | 56.6 | 57.5 |

TABLE 2

|  | CrN | CrMO | CrZr$_x$ | | | | |
| --- | --- | --- | --- | --- | --- | --- | --- |
| x | — | 0.06 | 0.01 | 0.02 | 0.04 | 0.05 | 0.06 |
| Atomic Percentage (%) | — | 5.8 | 0.6 | 1.9 | 3.9 | 4.7 | 5.7 |
| Crystal Structure | fcc amorph | bcc | bcc | bcc + Ω-hcp | bcc + Ω-hcp | bcc + Ω-hcp | bcc + Ω-hcp + amorph |
| Abrasion Resistance (%) | 100.0 | 60.0 | 80.2 | 113.2 | 116.0 | 129.2 | 97.2 |
| Chroma | 3.6 | 0.21 | 1.0 | 0.8 | 0.4 | 0.2 | 0.0 |
| Reflectivity (%) | 56.6 | 50.5 | 50.9 | 51.6 | 54.7 | 53.9 | 57.0 |

Examples—Crystal Structure of the Coating

The co-sputtering generates thin film coatings of Cr doped with another metal (Zr in the case of most of what is described here, but alternatively also Ti or Co, or less preferably Hf, Ru, Y and Os). As mentioned above, dopant materials such as these modify the structure of the Cr based coating by replacing Cr atoms within the bcc crystal lattice. This modification of the atomic structure of the bcc Cr coating was observed and quantified for the preferred Zr dopant material by measuring the lattice parameter of the crystal structure using electron diffraction. The incorporation of dopant and the resulting change in lattice parameter was observed to correlate with the macroscopic abrasion resistance. Depending on the class of the dopant metal (be it bcc or hcp) at room temperature, it was found that the degree of modification of the bcc Cr crystal lattice could be controlled.

An understanding of the atomic structure of the preferred binary alloys formed in the reflective coatings of the present invention was developed by conducting electron diffraction experiments on samples using a Philips CM200 Transmission Electron Microscope (TEM). These samples were prepared by sputtering directly onto NaCl crystals, dissolving away the crystal in Milli-Q water, and then floating the alloy coating onto an uncoated copper TEM grid. The samples included the use of the additional hcp transition metal Ti, plus the bcc transition metals Mo and W which were investigated for comparative purposes.

The diffraction pattern from each sample was analysed in order to determine the lattice parameter, ao, in the case of crystalline coatings or simply to confirm an amorphous structure when no crystalline material is observed. The experimental window for the dopant target power was chosen based on the overall maximum Bayer Ratio achieved for each dopant material. This window was in the range of 50 to 100 W. The resulting powers tested for the different alloy mixtures were Mo and W=100 W; and Co, Ti and Zr=50 W.

Figure 12:
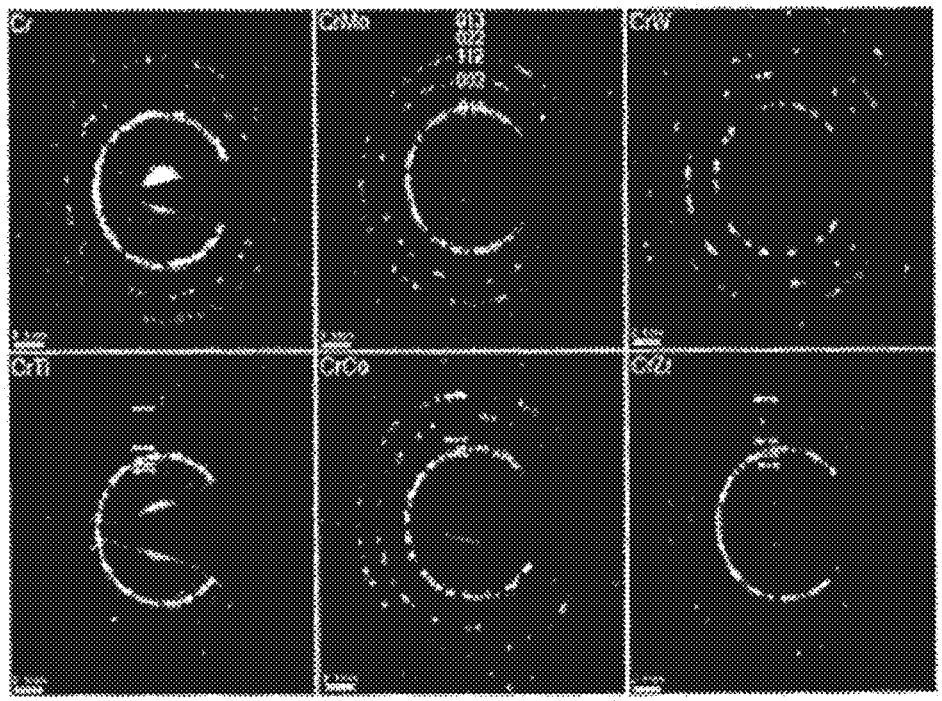
FIG. 12 shows diffraction patterns from a Transmission Electron Microscope for CrM$_x$ samples in accordance with embodiments of the present invention (M=Zr, Co and Ti) and for comparative purposes (M=W and Mo).

The dominant phase present for the solid solutions of these samples was found to be the bcc structure, however for certain samples additional phases were observed. The diffraction spectra of $CrCo_x$, $CrZr_x$ and $CrTi_x$ showed the presence of a secondary phase different from bcc as indicated by the arrows in FIG. 12. This secondary phase was identified as a $\Omega$-hcp phase, a displacive phase transformation from the bcc phase. Further to this analysis, it was noted that amorphous material is present in the background of the diffraction patterns, with this phase being most noticeable for the $CrTi_x$ alloy (the blurred background in the $CrTi_x$ diffraction image in FIG. 12).

Figure 13:
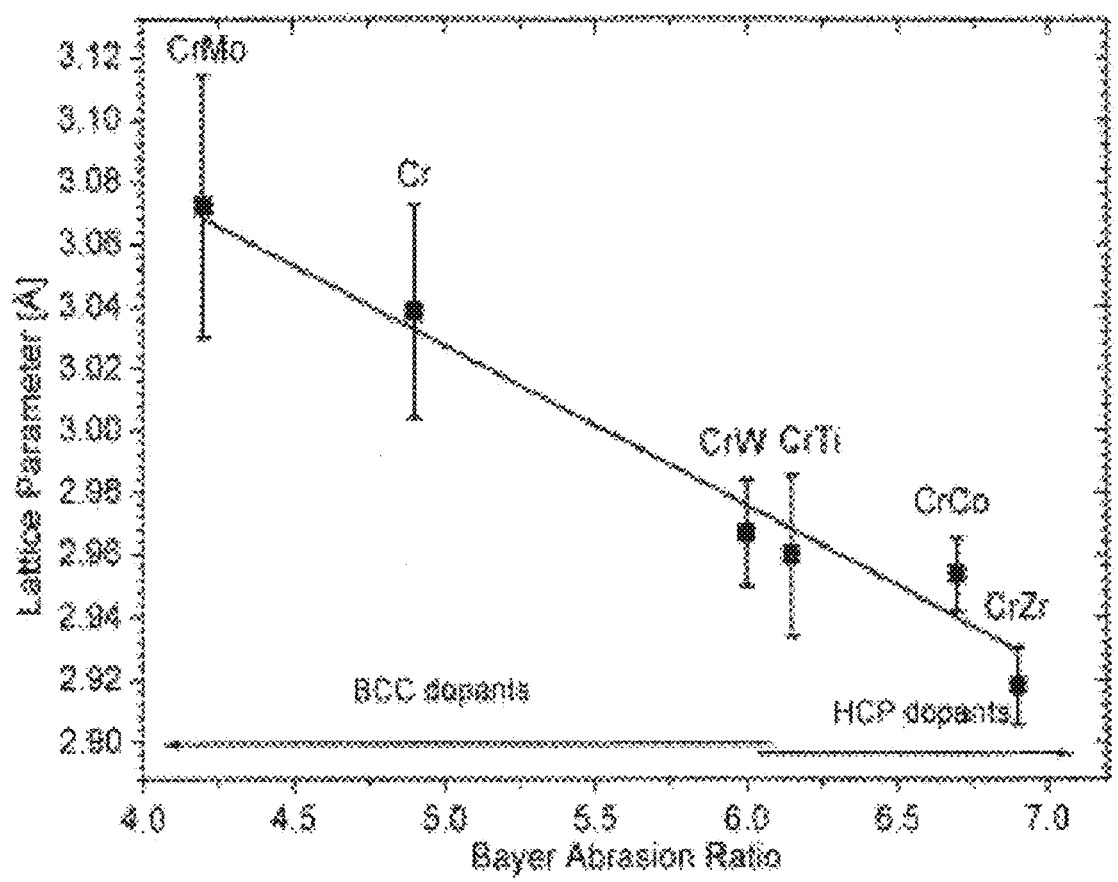
FIG. 13 shows the relationship between lattice parameter and abrasion resistance across the chromium based samples prepared for the examples.

The relationship between the atomic structure and the macroscopic abrasion resistance is evident in Tables 1, 2. Additionally, and as can be seen in FIG. 13, across the Cr based alloys of the samples, there is a clear trend that as the lattice parameter decreases the abrasion resistance increases. This increase in abrasion resistance is primarily attributed to the increase in packing density of the atoms.

Indeed, comparing the atomic radii of the dopant materials to that of Cr highlights that the change in lattice parameter of the $CrM_x$ alloys cannot be rationalised based on size constraints on the packing density (for example, W has a larger atomic radius yet a decrease in lattice parameter was observed for an alloy with W as the dopant material). Indeed, for transition metal alloys the electronic state of the atoms being alloyed and their electronic interaction generally play a contributing role in defining the lattice parameter. A comparison of the valence electrons for Cr ($4s^1$ and $3d^5$) with the preferred dopant materials of the present invention shows that Mo is comparable ($5s^1$ and $4d^5$), while the others have additional s-orbital and differing number of d-orbital valence electrons. The dopant materials with a differing number of valence electrons compared to Cr yielded a decrease in the lattice parameter in the alloy, while Mo (which is not one of the preferred hcp transition metals ideal for use as the dopant material) yielded an increase.

With respect to the mechanical properties of the preferred alloys of the present invention, these results contrast to other situations where the addition of dopant material with a greater number of valence electrons yields solid solution softening when alloyed with the group-VI metals of Mo and W.

While not wishing to be bound by theory, it is believed that the orbital overlap for the dopant materials with additional valence electrons increases the bonding strength in the alloy, thus yielding a reduced lattice parameter. Importantly, the bcc structure of the as-deposited Cr has been modified to a level by the dopant material where the abrasion resistance rivals that of an as-deposited bcc CrN coating (Bayer Abrasion Ratio~7 for an as-deposited $CrN_{1.3}$ coating using the custom-built reactor on the specially prepared substrates).

Finally, the preferred dopant materials utilised in this experimental work are also able to be categorised by their room temperature equilibrium structures. Mo and W are bcc at room temperature, while Ti, Co and Zr are hcp at room temperature. The hcp dopant materials achieve a greater reduction in lattice parameter than the bcc dopant materials. Given the observation of the electron structure of the dopant material influencing the bonding strength, it is believed that the hcp dopant material's electronic structure yields higher bond strengths. In addition, and as mentioned above, these hcp dopant materials yield the preferred composite film having both the bcc and the $\Omega$-hcp phase.

Rearview Assembly Device with Status Indicator

Figure 19:
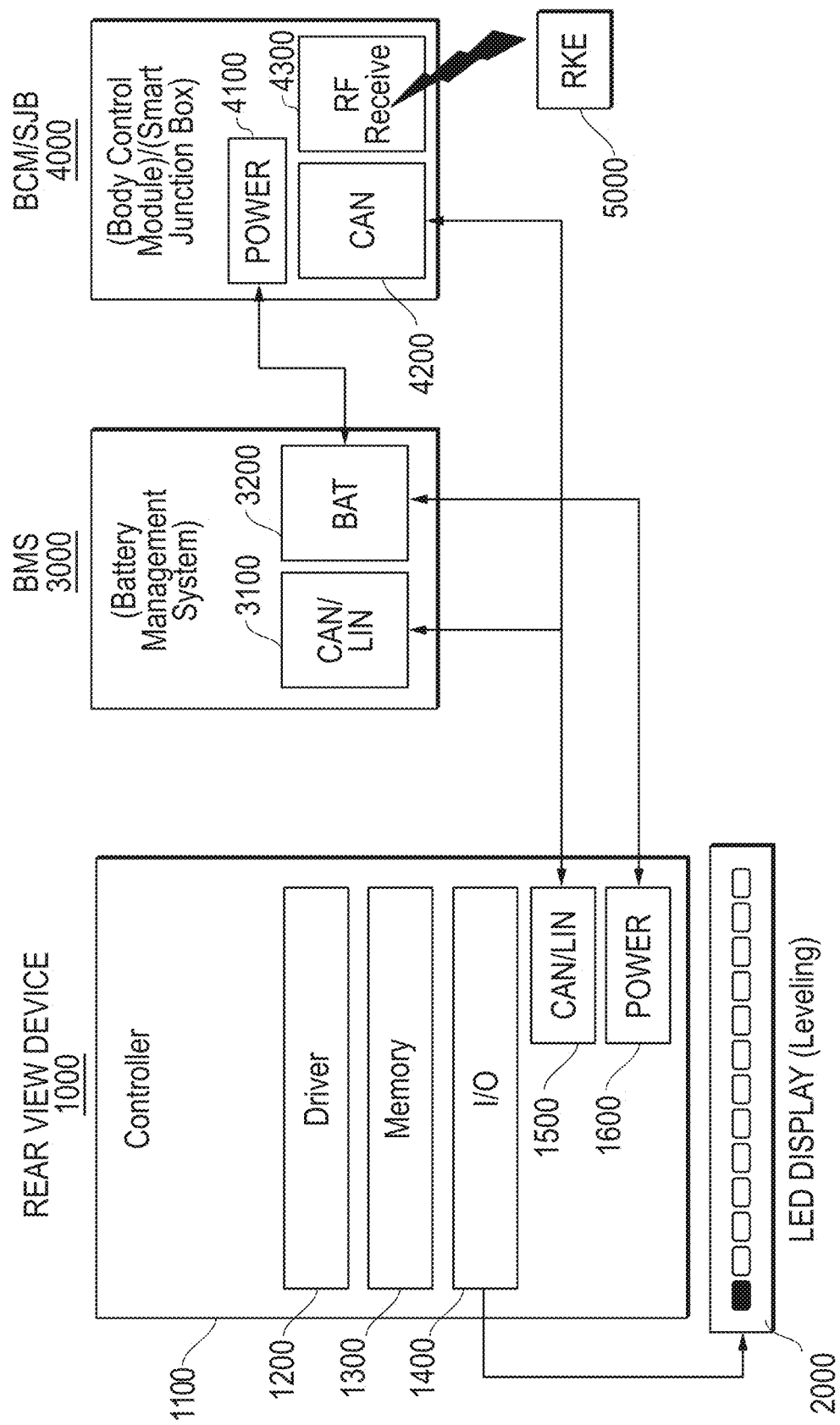
FIG. 19 is a block diagram illustrating an example of a system including a rearview assembly device for displaying a state of a vehicle, a battery management system, and a body control module and/or smart junction box.

FIG. 19 is a block diagram illustrating an example of a system including a rearview assembly device for displaying a state of a vehicle, a battery management system, and a body control module and/or smart junction box.

Referring to FIG. 19, the rearview device 1000 includes a controller 1100, the controller 1100 including a driver 1200, a memory 1300, an input/output (I/O) communication unit 1400, a Controller Area Network/Local Interconnect Network (hereinafter "CAN/LIN") 1500, and a power unit 1600. The input/output (I/O) unit 1400 of the rearview device 1000 communicates with an LED display 2000 which indicates to a driver, passenger, or user the level of energy such as battery level. The battery management system 3000 includes a CAN/LIN 3100, and a battery 3200. A Body Control Module/Smart Junction Box (hereinafter "BCM/SJB") includes a CAN 4200, an RF receiver 4300, and a power unit 4400.

In this example, there are four units in communication with one another to provide information to a driver on energy level such as battery charge information. These units include the rearview device 1000, the LED display 2000, the battery management system 3000, and the BCM/SJB 4000. In a first step, the RF receiver 4300 of the BCM/SJB 4000 may receive an unlock signal using a remote keyless entry unit 5000 to initiate an unlock operation for unlocking one or more doors of the vehicle. In response, the CAN 4200 of the BCM/SJB 4000 may communicate with the battery management system 3000 to send a signal indicating that the door unlocking operation was initiated. In response, the CAN/LIN 3100 of the battery management system 3000 may communicate with the CAN/LIN 1500 of the rearview device 1000 to send a signal indicating that the door unlocking operation was initiated. In response, the I/O unit 1400 may communicate with the LED display 2000 to send a signal to the LED display 2000 to display the energy charge such as battery charge information of the vehicle.

The battery charge information may be stored in a memory 1300 of the rearview device controller 1100 and obtained from the battery management system 3000. The battery 3200 of the battery management system 3000 may be connected to and provide power to the power unit 4100 of the BCM/SJB 4000 and the power unit 1600 of the rearview device 1000. The driver 1200 of the controller 1100 may contain one or more stored operations and commands which control the actions described above by the controller 1100 leading to the displaying of the battery charge information on the LED display 2000.

FIGS. 20A and 20B are diagrams illustrating an example of a rearview assembly device for displaying a state of a vehicle showing a low battery state and a full battery charged state.

Referring to FIGS. 20A and 20B, a rearview assembly device 6000 may include one or more LED lights 7000. In an example, the one or more LED lights 7000 may flash together as a side turn signal or hazard signal when the engine is operating or in response to the hazard operation being turned on by a driver or a user of the vehicle. The same one or more LED lights 7000 may, in another operation, be configured to display the amount of charge in a battery of the vehicle. For example, in response to a driver or a user unlocking the doors of the vehicle using a remote keyless entry unit 5000, the one or more LED lights 7000 may display the level of the battery state as illustrated in FIGS. 20A and 20B. For example, the number of LED lights 7000 which turn on may depend on the level of battery charge; in other words, when the battery is in a low state as detected from the battery management system 3000, only a few lights may turn on while in the fully charged state, all lights may turn on. In addition, one of the one or more LED lights 7000 may be configured to light up in different colors, for example, it may light up green to indicate that the battery is fully charged, red to indicate a low charge, yellow to indicate medium charge, or a number of other colors.

Referring to FIG. 20A, when the battery is at a low charge state, only four (or any limited number depending on the amount of charge) of the LED lights 7000 may be turned on from a right side of the indicator and may have a neutral color such as yellow or any other color. One or more additional LED lights may be turned on in the opposite side and have a color indicating the amount of charge such as red for low. The red light at the opposite end may flash or stay on, and in a preferred example, flashes to indicate a low battery state.

Referring to FIG. 20B, when the battery is at a full or high charge state, all (or any number depending on the amount of charge) of the LED lights 7000 may be turned on from a right side of the indicator and may have a neutral color such as yellow or any other color. One or more additional LED lights may be turned on in the opposite side and have a color indicating the amount of charge such as green or blue for high. The green or blue light at the opposite end may flash or stay on, and in a preferred example, stays on to indicate a high battery state.

Still referring to FIGS. 20A and 20B, the battery charge status is displayed on an outside mirror's turn signal lamp in response to the first remote keyless entry signal (door open) received. The battery charging state may also be displayed on the outside mirror LED for a period of time following the vehicle entering a stop/parking state.

In an example, the battery charge status indicator may work only in the state where the vehicle is stopped and/or the engine is off. Also, battery level checking and LED viewing operation may be activated by an RF signal received from an external wireless RF signal device such as a mobile phone or key. The RF receiver 4300 being a part of the BCM/SJB 4000.

As described above in reference to FIG. 19, the battery charge display may be for a predetermined period of time, the battery charge information being sent via CAN communication to the LED display 2000. This operation may be applicable for electric vehicles or battery re-charged vehicles or both. In an example, the range of operation contents and display method may be as follows: the vehicle's electronic system wakes up when an external operating signal is received (such as by remote keyless entry); the vehicle's battery management system sends to the LED control unit of the rearview assembly a CAN signal with battery status checking value, the outside LED mirror can provide the driver with battery charge status information using LED level display.

Also, this battery charge display function may be linked with the vehicle welcome function, and can be disabled or enabled by a separate setting as required. In order to implement this function, the door unlock or door lock RF signal may be received by BCM/SJB 4000 from the remote keyless entry for the vehicle to wake up first, then the CAN signal may be sent to the LED display 2000 on the outside mirror for LED leveling.

The above functions may also be applied in the case of a general vehicle, and it may include gasoline (fuel) remaining status monitor on a side mirror unit.

The battery charge display function may also detect the IGN (ignition) status, and the LED display may work so that it cannot display battery charge information during IGN ON state. If IGN ON state is enabled, the LED display may function so that it depends on the turn signal or hazard and not the battery charge information.

Also, flashing or blinking by the LED color corresponding to the battery level may be performed. For example, when in "Battery Full" mode: blue LED on or blinking; "Battery Normal" mode: green LED on or blinking; "Battery Low" mode: red LED on or blinking.

Lamp failure once the door is unlocked can be detected. For example, the failure status of the self-check system may be as follows: when the LED controller has critical problems—No LED is on; when the LED controller gets internal problems—all LED lights may blink as a warning.

This function may be applicable to all of vehicles which have an outside mirror structure and may also be applicable to all vehicles which have a Camera Monitoring System (CMS).

If battery monitoring system information is updating or the battery is being charged in the IGN OFF state, the LED lights 7000 may also display this via an indication such as progressively increasing the number of lights, the brightness of lights, or displaying a particular color.

In general, the battery charge display function may be dependent upon the malfunction switch operation after the IGN ON signal is activated. In case of battery monitoring system failure or wrong operation, the function may be malfunctioning. Also the function may be implemented through RF communication reception.

FIG. 21 is a diagram illustrating an example of LED status and display for a number of different battery or gasoline levels.

Referring to FIG. 21, an example of what may be displayed for very low, low, middle, and high battery levels are illustrated. At very low, a red LED may be on and remain on while no other LEDs are on. At low, a red LED may be blinking while one yellow LED may be on. At middle, a green LED may be blinking while a number of yellow LEDs may be on. At high or fully charged, a blue LED may be on and remain on while all yellow LEDs may be on.

In a preferred example, the above described light modules and rearview assemblies may be formed on or with the chromium based coated rearview device described throughout this application. For example, the rearview assembly device 6000 with the LED lights 7000 may include the reflective element 32 and reflective coating 36 described for the rearview device of FIGS. 1-3 or the reflective elements and coatings described throughout all embodiments of FIGS. 1-7.

Further, the rearview assembly device 6000 with the LED lights 7000 may be formed in accordance with the disclosure corresponding to FIGS. 8-18. For example, the LED lights 7000 may substitute for the side turn indicator 3 of the polymeric housing 1 of FIGS. 15-16. That is, the housing may be coated by a chromium-based reflective coating so that the LED lights 7000 may be substantially not visible in the deactivated state, and merely looking at the outside of the polymeric housing gives no indication is given that LED lights 7000 are arranged inside. Similarly, as shown in FIG. 16, the LED lights 7000 may act like the side turn indicator 3 in the activated state, where light originating from the LED lights 7000 shines through the housing and through the chromium-based reflective coating when activated. The LED lights 7000 may also be used with all chromium-based reflective coating applications as described in reference with FIGS. 17A-C and 18.

It will be appreciated by those skilled in the art that changes could be made to the embodiments described above without departing from the broad inventive concept thereof. It is understood, therefore, that the invention disclosed herein is not limited to the particular embodiments disclosed, but it is intended to cover modifications within the spirit and scope of the present invention as defined by the appended claims.

It will be appreciated by those skilled in the art that changes could be made to the embodiments described above without departing from the broad inventive concept thereof. It is understood, therefore, that the invention disclosed herein is not limited to the particular embodiments disclosed, but it is intended to cover modifications within the spirit and scope of the present invention as defined by the appended claims.

The invention claimed is:

1. A rearview assembly for a vehicle comprising:
   a polymeric rearview assembly housing which is coated with a chromium-based reflective coating;
   an indicator disposed within or on an outer surface of the polymeric rearview assembly housing; and
   a controller configured to receive information on a battery level or a gasoline level of the vehicle,
   wherein the indicator is configured to use the received information to display the battery level or the gasoline level of the vehicle, and
   the polymeric rearview assembly housing and the chromium-based reflective coating are both at least partially permeable to light originating from the indicator,
   wherein the indicator comprises one or more light sources configured to turn on or off using the received information to display the battery level or the gasoline level of the vehicle, and
   wherein the indicator is configured to be operated by a remote control which is part of a vehicle locking system, a garage opening system, or other remote activation system.

2. The rearview assembly of claim 1, wherein the chromium based coating of the polymeric rearview assembly housing results in the indicator being invisible until lit.

3. The rearview assembly of claim 1, wherein the one or more light sources are further configured to operate as a turn signal which is visible to a driver of the vehicle and other road users in response to a turn signal being activated.

4. The rearview assembly of claim 1, wherein the one or more light sources are further configured to operate as a hazard signal which is visible to a driver of the vehicle and other road users in response to a hazard signal being activated.

5. The rearview assembly of claim 1, wherein, in response to the vehicle's ignition being turned on, the one or more light sources are configured to operate as at least one of a turn signal and a hazard signal which are visible to a driver of the vehicle and other road users, and cannot operate to display the battery level or gasoline level of the vehicle.

6. The rearview assembly of claim 1, wherein the controller comprises
   a driver for running operations;
   a memory for storing vehicle information;
   an input/output unit for sending signals to the one or more light sources; and
   a CAN/LIN for communicating with the vehicle.

7. The rearview assembly of claim 1, wherein the one or more light sources are configured to project more than one color using the received information on the battery level or the gasoline level of the vehicle.

8. The rearview assembly of claim 1, wherein the one or more light sources are a plurality of light sources which are arranged in a line along the polymeric rearview assembly housing.

9. The rearview assembly of claim 8, wherein all of the plurality of light sources turn on in response to receiving information that the battery level or gasoline level is full, and one or more light sources of the plurality of light sources are off in response to receiving information that the battery level or gasoline level is low.

10. The rearview assembly of claim 8, wherein at least one of the plurality of light sources is configured to blink.

11. The rearview assembly of claim 1, wherein the rearview assembly comprises one or more of a reflective element and a camera, and the polymeric rearview assembly housing at least partly houses the one or more of the reflective element and the camera.

12. The rearview assembly of claim 1, wherein the indicator is incorporated into the polymeric rearview assembly hosing by over-molding the indicator with polymeric material of the polymeric rearview assembly hosing.

13. The rearview assembly of claim 1, wherein the indicator comprises a polymeric light pipe which comprises at least one LED lamp to illuminate the light pipe.

14. The rearview assembly of claim 1, wherein the chromium-based reflective coating is an alloy of chromium and a dopant material, the dopant material being selected from hexagonally close-packed transition metals and the alloy having a crystal structure of a primary body-centered cubic phase in coexistence with a secondary omega hexagonally close-packed phase.

15. The rearview assembly of claim 14, wherein the alloy is a binary alloy of chromium and the dopant material.

16. The rearview assembly of claim 15, wherein the atomic percentage of the dopant material in the binary alloy is in the range of from about 1.9 at. % to about 5.8 at. %.

17. The rearview assembly of claim 14, wherein the dopant material is selected from the hexagonally close-packed transition metals zirconium, titanium, cobalt, hafnium, rubidium, yttrium and osmium.

18. The rearview assembly of claim 14, wherein the dopant material is selected from the hexagonally close-packed transition metals zirconium, titanium, cobalt, hafnium, rubidium, yttrium and osmium.

19. The rearview assembly of claim 14, wherein the alloy is a binary alloy and the dopant material is zirconium, and wherein the atomic percentage of the zirconium in the binary alloy is in the range of from about 4.5 at. % to about 5.8 at. %.

20. The rearview assembly of claim 14, wherein the alloy is a binary alloy and the dopant material is titanium, and wherein the atomic percentage of the titanium in the binary alloy is in the range of from about 1.9 at. % to about 5.8 at. %.

21. The rearview assembly of claim 14, wherein the alloy is a binary alloy and the dopant material is cobalt, and wherein the atomic percentage of the cobalt in the binary alloy is in the range of from about 1.9 at. % to 5.7 at. %.

22. The rearview assembly of claim 1, wherein the chromium-based reflective coating has a thickness of 200 nm or less.

23. The rearview assembly of claim 1, wherein the thickness of the reflective coating is 100 nm or less.

24. The rearview assembly of claim 1, wherein the thickness of the reflective coating is in the range of from 40 nm to 80 nm.

25. The rearview assembly of claim 1, wherein the thickness of the reflective coating is in the range of from 50 nm to 70 nm.

26. The rearview assembly of claim 1, wherein the thickness of the reflective coating is about 60 nm.

27. A vehicle, comprising
a rearview assembly, comprising
a polymeric rearview assembly housing which is coated with a chromium-based reflective coating;
an indicator disposed within or on an outer surface of the polymeric rearview assembly housing; and
a controller configured to receive information on a battery level or a gasoline level of the vehicle;
at least one of a battery management system and a gasoline management system; and
a body control module for receiving a door lock/unlock signal;
wherein the indicator is configured to display the battery level or the gasoline level of the vehicle in response to the body control module receiving the door lock/unlock signal, and
the polymeric rearview assembly housing and the chromium-based reflective coating are both at least partially permeable to light originating from the indicator.

28. The vehicle of claim 27, wherein the indicator comprises one or more light sources configured to turn on or off using the received information to display the battery level or the gasoline level of the vehicle.

29. The vehicle of claim 28, wherein, in response to the vehicle's ignition being turned on, the one or more light sources are configured to operate as at least one of a turn signal and a hazard signal which are visible to a driver of the vehicle and other road users, and cannot operate to display the battery level or gasoline level of the vehicle.

30. The vehicle of claim 27, wherein the controller comprises a CAN/LIN, the at least one of the battery management system and the gasoline management system comprise a CAN/LIN, and the body control module comprises a CAN which are all in communication with one another.

31. The vehicle of claim 27, wherein the rearview assembly further comprises one or more of a reflective element and a camera, and the rearview assembly housing at least partly houses the one or more of the reflective element and the camera.

32. The vehicle of claim 27, wherein the indicator is configured to be operated by a remote control which is part of a vehicle locking system, a garage opening system, or other remote activation system.

33. A rearview assembly for a vehicle comprising:
a rearview assembly housing;
an indicator disposed within or on an outer surface of the rearview assembly housing; and
a controller configured to receive information on a battery level or a gasoline level of the vehicle,
wherein the indicator is configured to use the received information to display the battery level or the gasoline level of the vehicle, and the indicator is configured to display the battery level or the gasoline level of the vehicle in response to a vehicle lock or vehicle unlock command being initiated.

* * * * *